United States Patent
Lee (12)

(10) Patent No.: US 6,307,424 B1
(45) Date of Patent: Oct. 23, 2001

(54) PROGRAMMABLE IMPEDANCE CONTROL OUTPUT CIRCUIT AND PROGRAMMABLE IMPEDANCE CONTROL METHOD THEREOF IN SEMICONDUCTOR DEVICE

(75) Inventor: Kwang-Jin Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/656,975

(22) Filed: Sep. 7, 2000

(30) Foreign Application Priority Data

Sep. 7, 1999 (KR) .................................................. 99-37795

(51) Int. Cl.[7] ...................................................... H02J 3/38
(52) U.S. Cl. ............................. 327/530; 327/538; 326/30
(58) Field of Search ............................... 327/77, 73, 334, 327/513, 530, 538; 326/30, 82, 83

(56) References Cited

U.S. PATENT DOCUMENTS 6,147,520 * 11/2000 Kothandaraman et al. ........... 327/77
6,175,250 * 1/2001 Hedberg ................................. 326/83

* cited by examiner

*Primary Examiner*—Kenneth B. Wells
*Assistant Examiner*—Paul Dinh
(74) *Attorney, Agent, or Firm*—Marger Johnson & McCollom, P.C.

(57) ABSTRACT

The invention relates to an impedance control output circuit of a semiconductor device and a method relevant thereto to prevent or minimize various problems caused by a transmission error by automatically resetting the impedance mismatch resulting from variances of supply voltage, temperature, other operational conditions. The impedance control output circuit of the semiconductor device comprises: an impedance detection, comparison and adjustment part for performing a normal operation and an automatic reset operation by comparing array reference voltage with pad voltage of a pad connected to an external resistance to obtain the pad voltage tracking the array reference voltage and by comparing the array reference voltage with the reference voltage predetermined by a resistant voltage divider for resetting the level of the array reference voltage to obtain the array reference voltage tracking the constant reference voltage; and a driving and data outputting part for driving impedance of a data output terminal of the semiconductor device in response to results of the normal and automatic reset operation to thereby output the internal data.

43 Claims, 18 Drawing Sheets

ZQ CONTROL

ZQ CONTROL

HIGHER CODE SELECTOR

HIGHER CODE SELECTOR

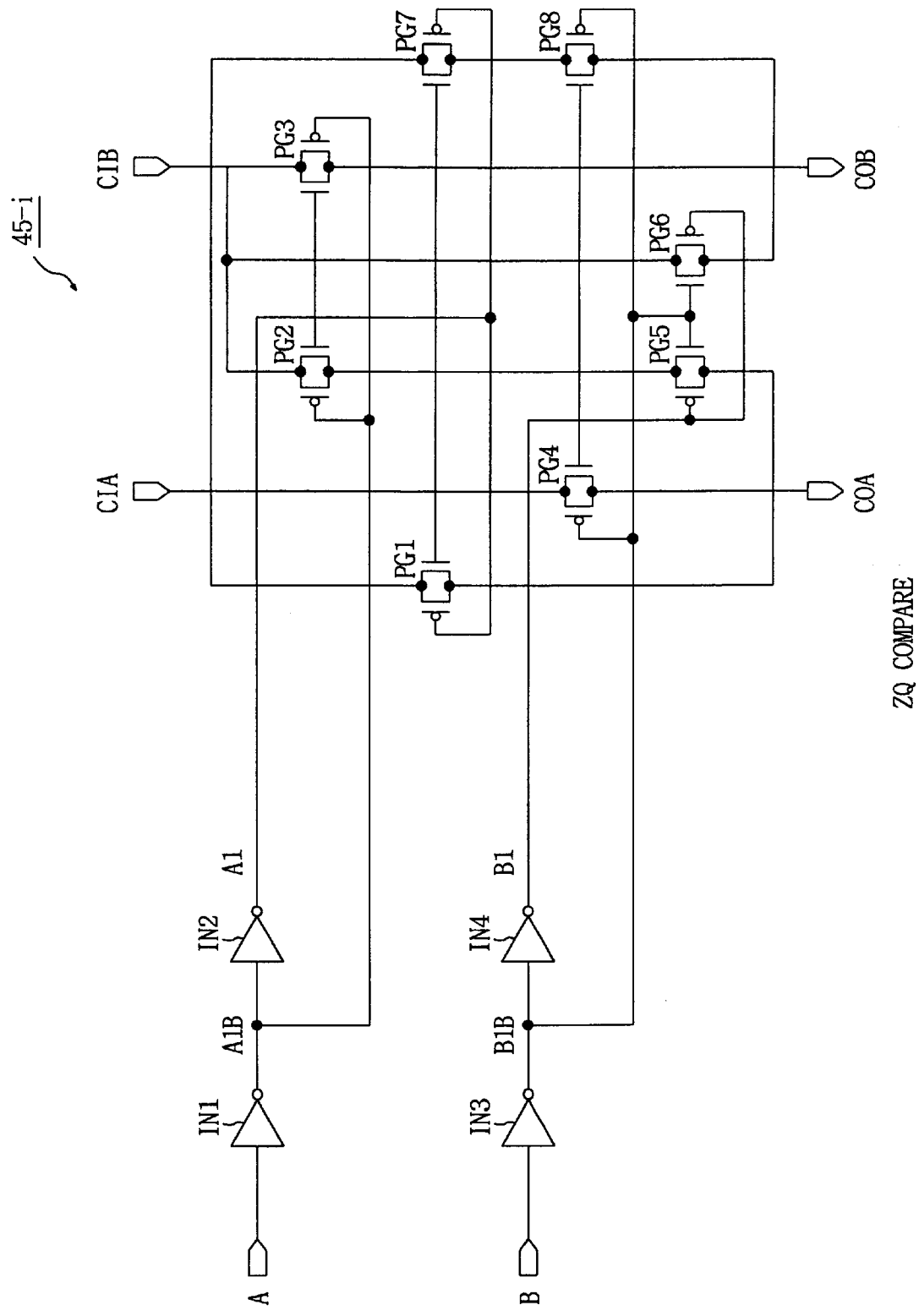

FIG. 14
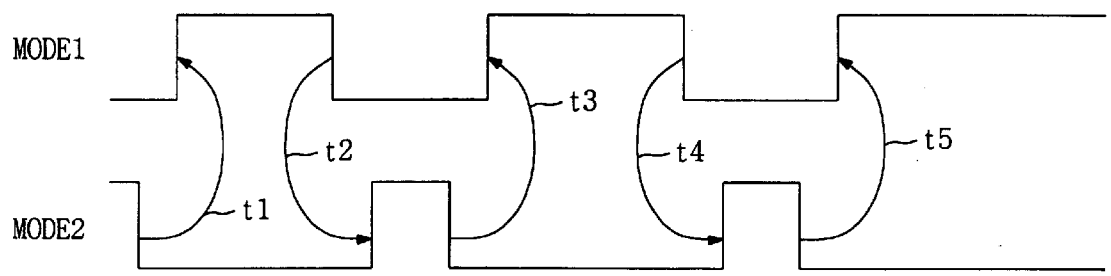
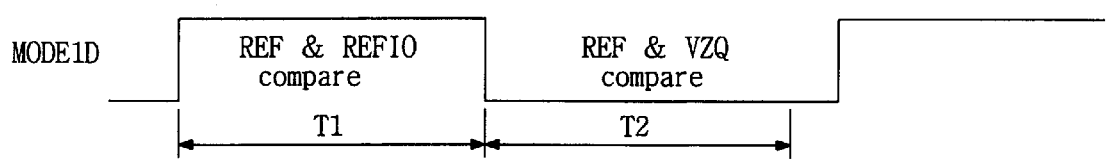
FIG. 15
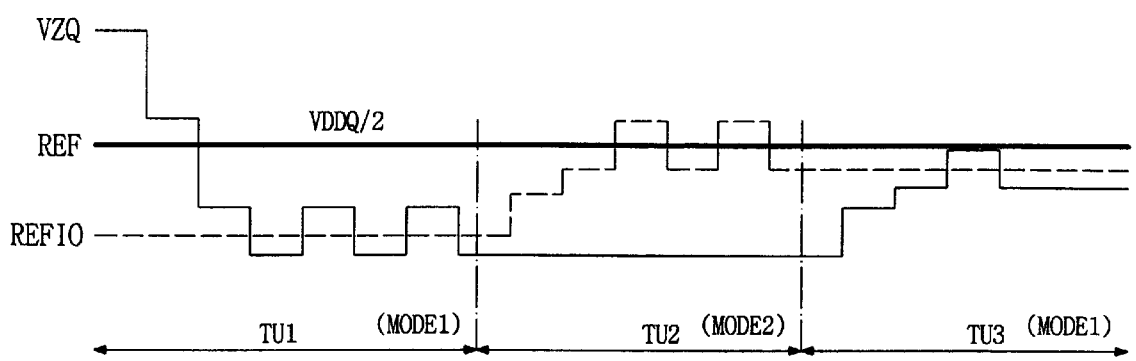

PROGRAMMABLE IMPEDANCE CONTROL OUTPUT CIRCUIT AND PROGRAMMABLE IMPEDANCE CONTROL METHOD THEREOF IN SEMICONDUCTOR DEVICE

BACKGROUND OF THE INVENTION

1. Field of the Invention

The present invention relates to a semiconductor device and, more particularly, to a semiconductor device having an output circuit that controls an impedance match and outputs an internal data,

2. Description of the Prior Art

Various semiconductor devices such as microcomputers, memories, gate arrays and the like are integrated into various electrical products such as personal computers, workstations and the like. Most semiconductor devices have input/output (I/O) pins for transmitting data externally, and output circuits such as an output buffer and driver circuit for outputting the internal data externally. When the semiconductor devices are integrated within the electrical products, the I/O pins are connected to transmission lines such as printed wiring on a substrate. Accordingly, the internal data of a semiconductor device is transmitted to another semiconductor device through the transmission line as an interface. In this case, the output impedance of the I/O pin and the impedance of the transmission line must be matched in order for the output data of the semiconductor device to be transmitted through the transmission line.

As the operational speed in the electrical products is improved, the signal swing at the interface between the semiconductor devices needs to be reduced. This is because a short signal swing minimizes transmitting delay time.

However, while the swing width is reduced, the external noise is increased, and the reflection of the output signal becomes critical responsive to an impedance mismatch in an interface terminal. The impedance mismatch may result from external noise, variances in voltage, operational temperature or manufacturing process, and the like. The impedance mismatch might cause difficulties in transmitting high speed data, and result in data skewing at a data output terminal of a semiconductor device.

In a case where the semiconductor device receives the skewed output signal at an input terminal, a set-up/hold failure or min detection in an input level may be caused. A semiconductor memory device having the variable impedance control shown in FIG. 1 in order to perform impedance matching between external semiconductor devices. For example, in the case of HSTL (High Speed Transceiver Logic) interface, one extra pin is used within about several tens of ohm ($\Omega$) to keep the desired output impedance value. However, the semiconductor memory device adapted for such an impedance matching method cannot frequently obtain the desired output impedance value due to variances in power voltage, operational temperature, process and the like. To solve such a problem, the conventional semiconductor device is provided with a control part having a metal option, bonding option, or fuse option. The control part is used in controlling the scope of resistance value or the reference level for impedance matching. Therefore, such conventional techniques require many hours in test, and also need a separate process for controlling consequently increasing manufacturing costs.

Accordingly, a supplemental technique is required to perform desired impedance matching irrespective of variances in power voltage, operational temperature and manufacturing process.

BRIEF DESCRIPTION OF THE DRAWINGS

For a fuller understanding of the nature and object of the invention, reference should be made to the following detailed description taken in conjunction with the accompanying drawings.

FIG. 9 is a circuit diagram for illustrating an embodiment of the ZQ comparator shown in FIG. 8.

FIG. 14 illustrates a wave form of the mode signals output from the flip-flop shown in FIG. 10.

FIG. 15 illustrates a shifting wave form of the impedance match for an automatic reset operation according to the impedance control method of the present invention.

DETAILED DESCRIPTION OF THE INVENTION

Figure 1:
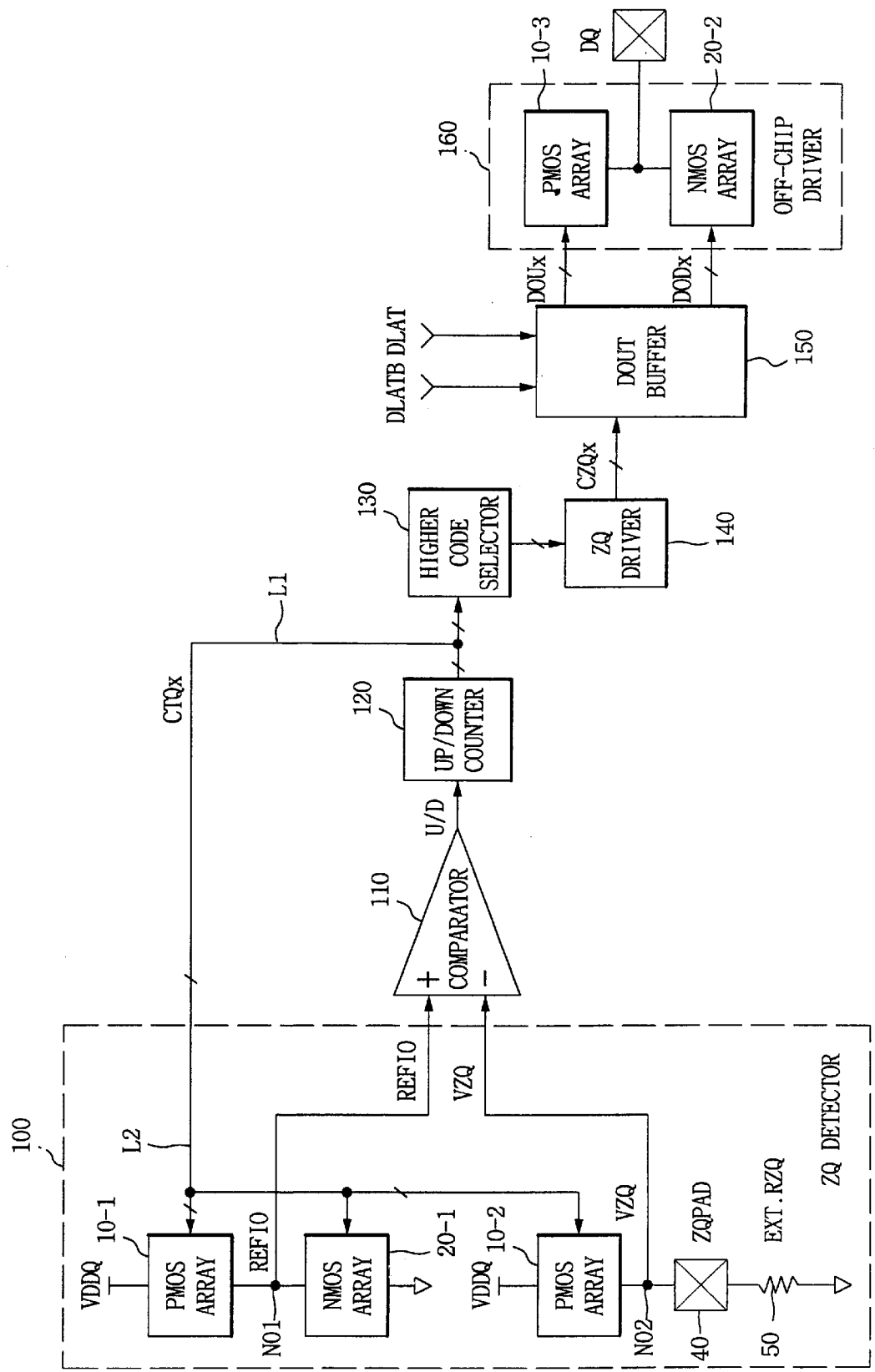
FIG. 1 is a block diagram for illustrating an impedance controlling output circuit of a conventional semiconductor device.

A preferred embodiment of the present invention will be described in detail with reference to the accompanying drawings. Throughout the drawings, like reference numerals and nomenclature are used for designation of like portions, detailed description of which will be omitted.

FIG. 1 is a block diagram of the variable impedance control and output circuits that are applicable to a part of the structure of the present invention. The variable impedance control circuit comprises a ZQ (impedance) detector 100, a comparator 110 an up/down counter 120, a higher code selector 130, and a ZQ driver 140. The output circuit comprises a DOUT buffer 150 and a chip driver 160.

The impedance controlling method as illustrated in FIG. 1, in the case of HSTL, the semiconductor device may have an extra pin connected to an external resistor to thereby restrict the desired output impedance value in the range of about 35 to 70 ohm ($\Omega$). First, the external resistor 50 for matching, which has a resistance value RZQ about five times as great as impedance value of the external device, is connected between the extra pad ZQPAD 40 of the ZQ detector 100 and ground. A level of the reference voltage REFIO at the common node NO1 of the PMOS and NMOS transistors is predetermined as half the output power voltage (VDDQ/2). The comparator 110 compares the reference voltage REFIO level of the common node NO1 with the pad voltage VZQ level of the node NO 2, thereafter outputting the up/down control signal U/D. The up/down counter 120 counts increase and/or decrease in response to the up/down control signal U/P to output the control code data CTQx for selectively turning on/off the PMOS and NMOS transistors (PMOS, NMOS). The up/down counter 120 increases or deceases the control code data CTQx until a level of the reference voltage REFIO becomes identical to that of the pad voltage VZQ. Accordingly, the PMOS transistor selected in the PMOS arrays 10-1, 10-2 and the NMOS transistor selected in the NMOS array 20-1 are turned on/off, so that a level of the reference voltage REFIO and that of the pad voltage VZQ become identical to each other. In this case, a level of the reference voltage REFIO and a level of the pad voltage VZQ relate to VDDQ/2, and the resistance value of the turned-on state of the PMOS array 10-2 becomes identical to the resistance value RZQ of the external resistance 50. Thus, as in the PMOS transistor within the PMOS array 10-1 and the NMOS transistor within the NMOS array 20-1, which are in the turned-on state, the transistors within the off-chip driver 160 are kept turned-on, thereby allowing the output impedance to match with the external impedance. The transistor within the off-chip driver 160 are turned on in the same number as those of the PMOS array 10-1 and NMOS array 20-1 because the PMOS array 10-1 is identical to the PMOS array 10-3 within the off-chip driver 160 in its internal structure, the NMOS array 20-1 is identical to the NMOS array 20-2 in its internal structure. Accordingly, the higher code selector 130, ZQ driver 140 and DOUT buffer 150 are operated. The higher code selector 130 selects higher control code data CTQx among a plurality of control code data CTQx received in the process of impedance matching. The ZQ driver 140 generates the drive code data CZQX to provide to the DOUT buffer 150 in response to the control code data CTQx selected when the off-chip driver 160 is in a high impedance state. Accordingly, the prior drive code data CZQx is renewed in response to a change of the selected control code data CTQx. The renewed drive code data CZQx is inputted to the DOUT buffer 150, and the unit buffer selected from the unit buffers within the DOUT buffer 150 is just enabled in response to the renewed drive code data CZQX. Thus, the unit buffer enabled within the DOUT buffer 150 receives the memory cell data DLATB and DLAT to generate the pull-up output data DOUx and pull-down output data DODx, The generated data are outputted to the off-chip driver 160 to turn on the corresponding transistors within the PMOS array 10-3 and NMOS array 20-2. Accordingly, Signal levels of the final output data are determined by the selected transistors in the off-chip driver 160, thereafter being outputted to the external through the output terminal DQ. The output impedance value of the output data at tee time of output becomes identical to the impedance value of the external semiconductor device in the process of the impedance control, thereby allowing the impedance matching Thus, the output data is transmitted to the interface line without distortion because reflection of the output signal is not generated or minimized.

However, since the technique as described above is directly affected by variance in power voltage (supply voltage), it is difficult to maintain a level of reference voltage in a steady state for a long time. Also, it is difficult to exactly reach a predetermined value of output impedance due to characteristic variance of the transistor within the PMOS array and NMOS array, which is caused by variance in temperature or change in manufacturing process. In order to solve such problems, any controlling part having metal option, or bonding option, or fuse option is additionally provided to the conventional semiconductor devices and any reset for impedance matching has been performed with the controlling part by fine-controlling the range of resistance value or reference level for the impedance matching. Accordingly, testing requires an inordinate amount of time, any separate process for fine-controlling must be performed, and output operation is unstable because impedance-matching operation is not stable.

Figure 2:
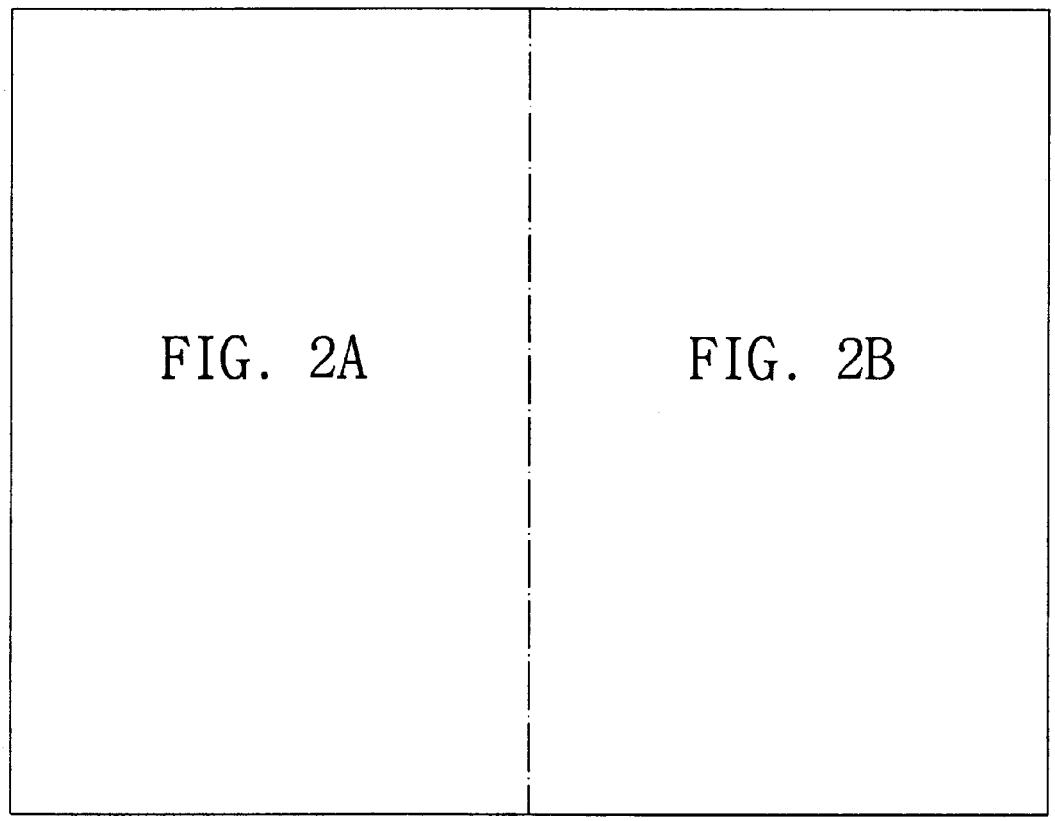
FIGS. 2A and 2B are block diagrams for illustrating programmable impedance controlling output circuits having an automatically resetting function of a semiconductor device in accordance with the present invention.

The circuit shown in FIG. 2 solves the above referenced problems according to an embodiment of the present invention. An "off-chip drivers"is described in U.S. Pat. No. 5,440,258 issued to Galbi ct al. The "off-chip drive" will not herein be explained in her detail.

Figure 2A:
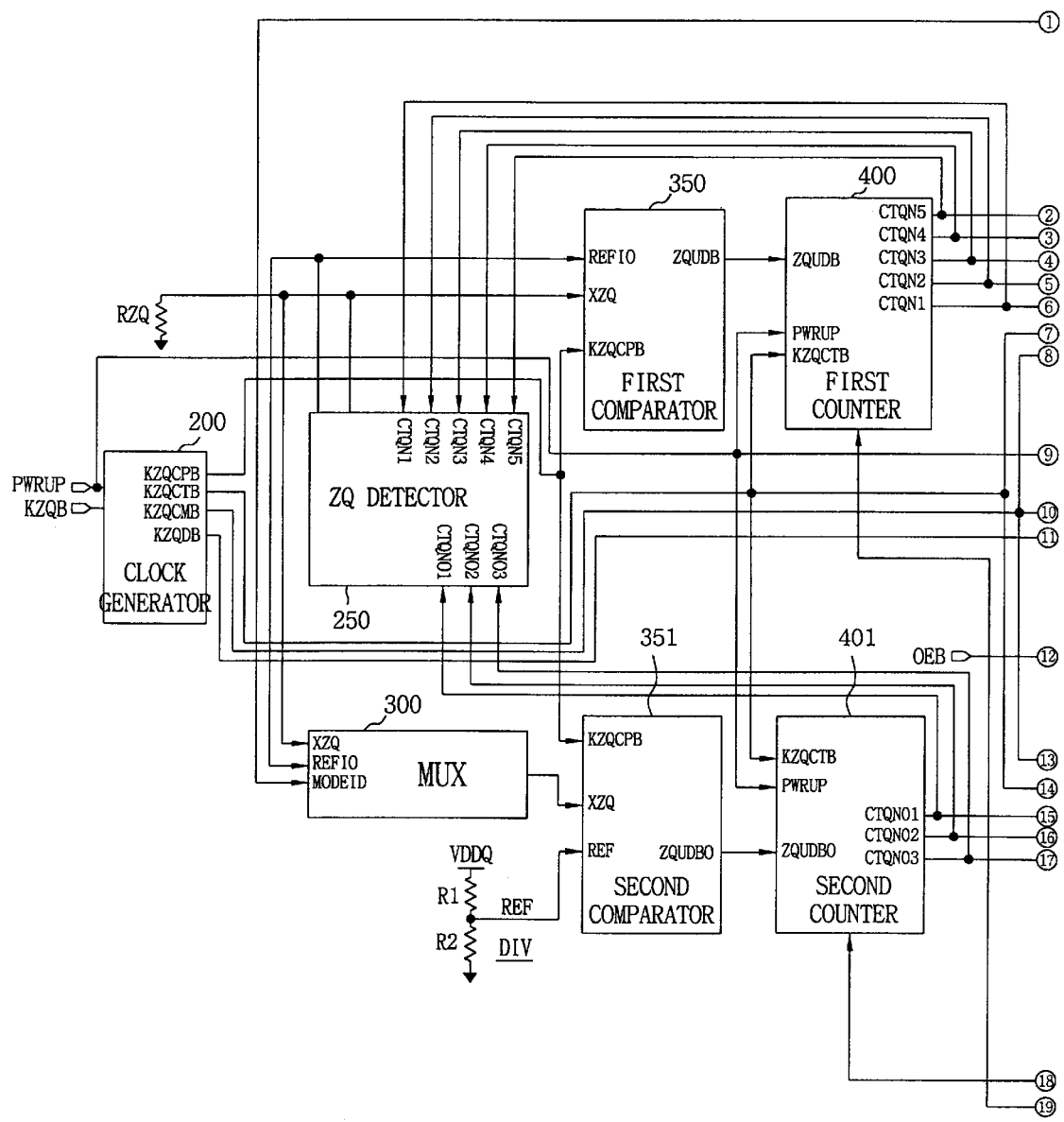
Figure 2B:
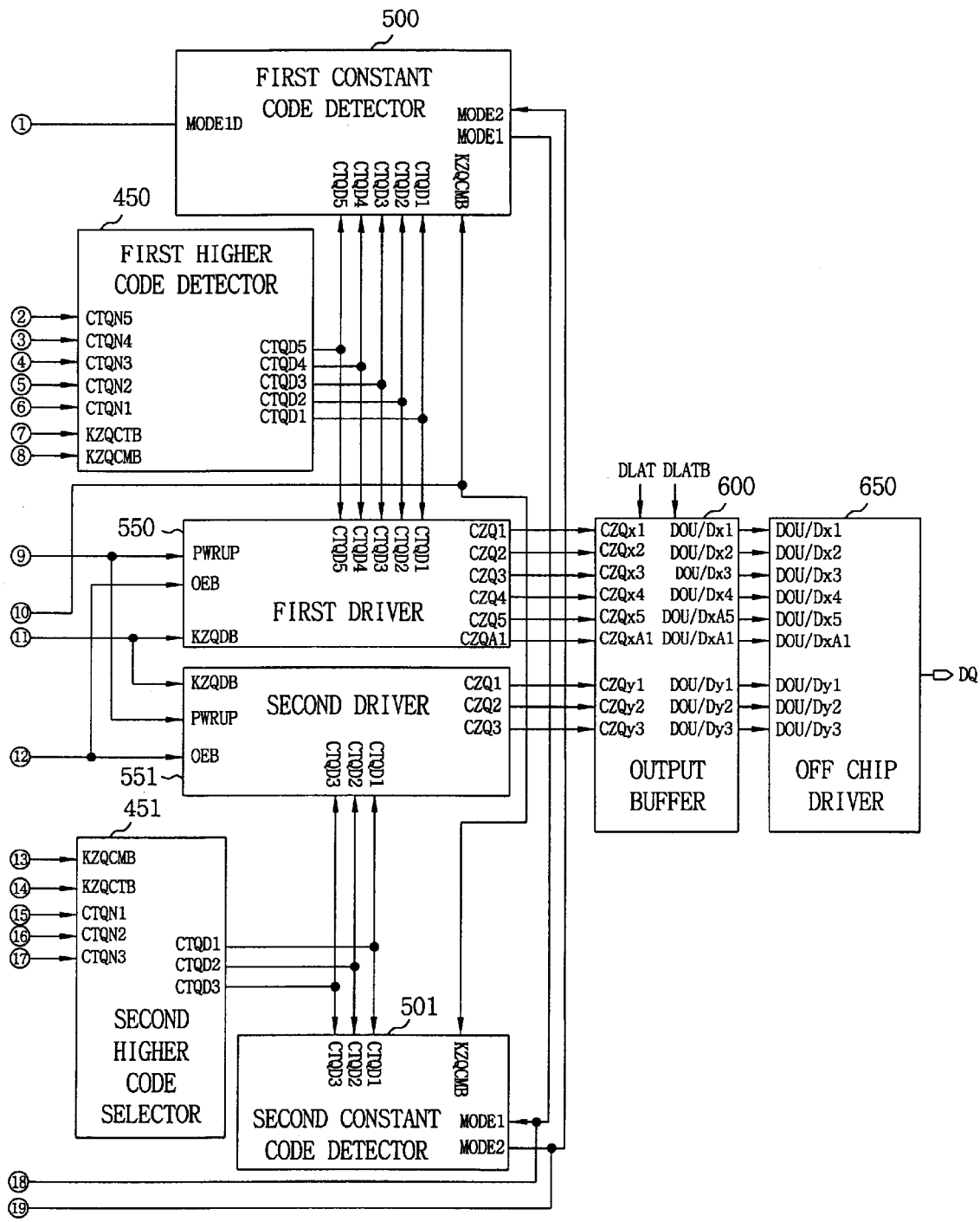

FIGS. 2A and 2B are block diagrams of programmable impedance controlling output circuits having an automatically resetting function according to the present invention. Referring to FIG. 2 (2A and 2B), the programmable impedance control output circuit comprises a impedance detect and compare controlling part and a drive and data-output part. The impedance detect and compare controlling part includes a clock generator 200, an impedance detector 250, a multiplexer 300, first and second comparators 350, 351, first and second counters 400, 401, first and second higher code selectors 450, 451 and first and second constant code detectors 500, 501. The drive and data-output part includes first and second drivers 550, 551, data output buffer 600 and an off-chip driver 650.

The impedance detect and compare controlling part serves to compare the array reference voltage REFIO with the pad voltage XZQ of a pad connected to the external resistance RZQ, thereby allowing the pad voltage XZQ to track the array reference voltage REFIO in a normal operation. The controlling part also serves to compare the reference voltage REF predetermined by the voltage divider DIV to reset a level of the array reference voltage REFIO or the pad voltage XZQ, thereby allowing the array reference voltage REFIO or the pad voltage XZQ to track the constant reference voltage REF in an automatic-reset operation. The drive and data output part performs impedance-driving of the data output terminal in response to the normal and automatic reset operations to output the internal data in a impedance-matching state.

Figure 3:
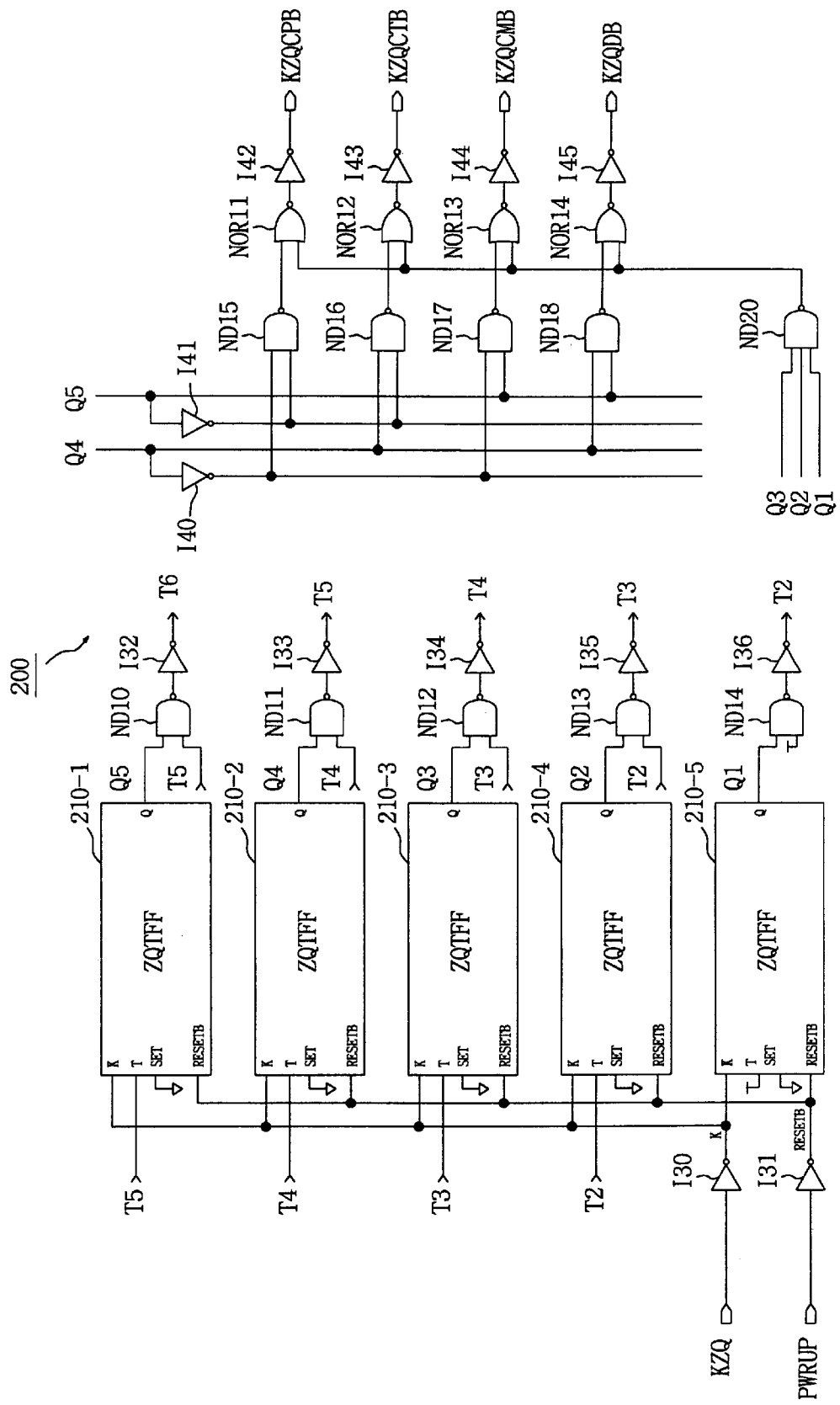
FIG. 3 is a circuit diagram for illustrating an embodiment of the clock generator shown in FIG. 2.
Figure 4:
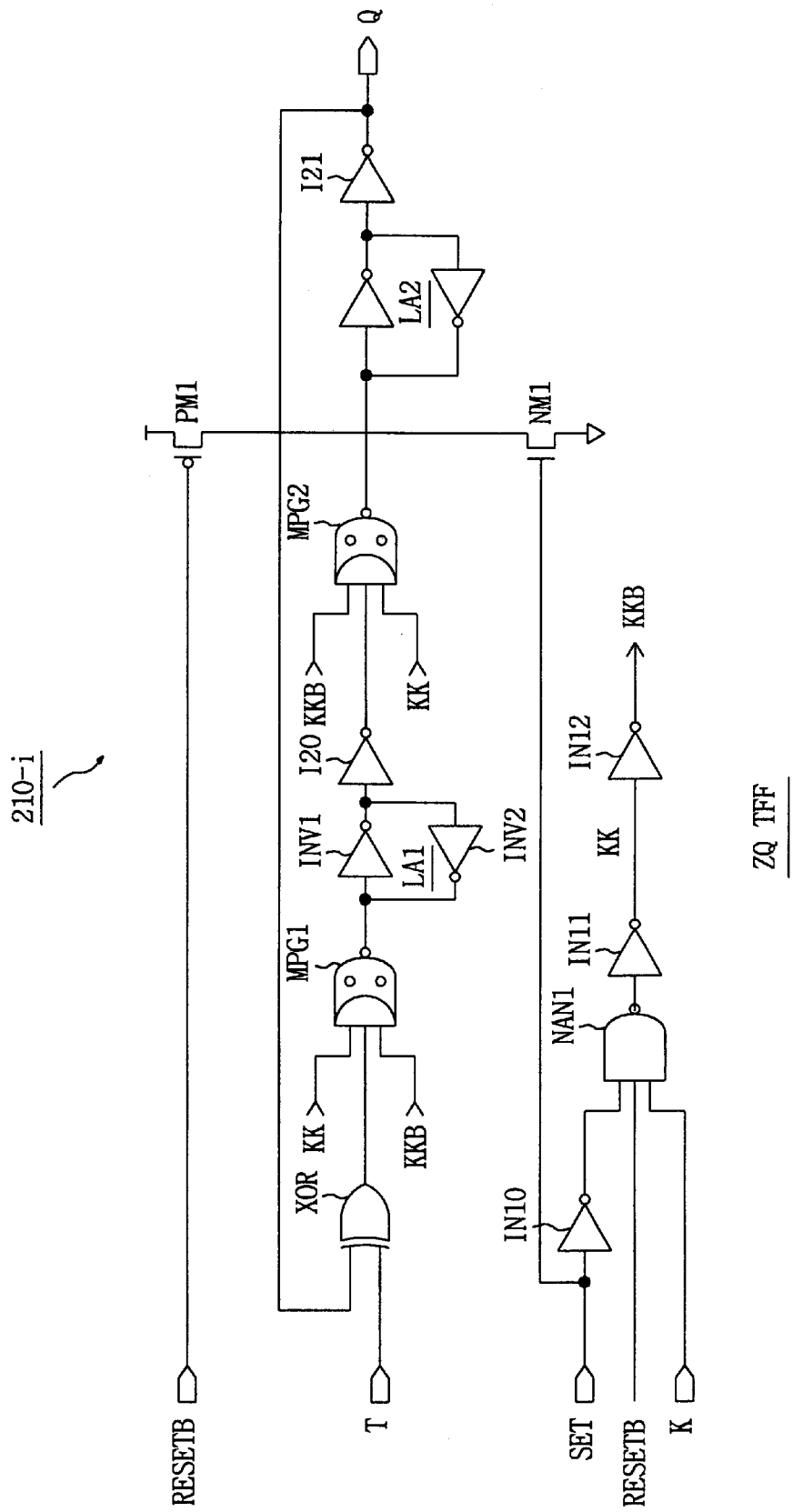
FIG. 4 is a circuit diagram for illustrating an embodiment of the T flip-flop shown in FIG. 3.

The clock generator 200 generates the clock control signals KZQCPB, KZQCTB, KZQCMB, KZQBD related to impedance-matching to transmit them to an internal circuit. The clock generator 200 can be made as shown in FIG. 3 to generate the clock control signals. FIG. 3 is a detailed circuit diagram illustrating an embodiment of the clock generator 200 as shown in FIGS. 2A and 2B. FIG. 4 is a detailed circuit diagram showing an embodiment of the T-flip-flop 210-I in FIG. 3. Referring to FIG. 3, the clock generator 200 comprises an inverter 130 for inverting a level of the control signal KZQ, an inverter I31 for inverting the power-up control signal PWRUP, T-type flip-flops 210-1, . . . , 210-5, NAND gates ND10, . . . , ND14 connected to each of terminals Q of the T-type flip-flops 210-1, . . . , 210-5 in one side thereof, a plurality of inverters I32, . . . , I36 connected to output of the NAND gates ND10, . . . ND14, respectively, inverters I40, I41 for inverting output of the output terminals Q4, Q5 of the T-type flip-flops 210-1, 210-2 selected from the T-type flip-flops 210-1, ..., 210-5, a NAND gate ND15 for generating a NAND response by receiving the respective output of the inverters I40, I41, a NAND gate ND16 for generating a NAND response by NAND-gating the outputs of the inverter I41 and the output terminal Q4, a NAND gate ND17 for generating a NAND response by NAND-gating the outputs of the inverter I40 and output terminal Q5, a NAND gate ND18 for generating a NAND response by NAND-gating the outputs of the output terminal Q4 and another output terminal Q5, a NAND gate ND20 for generating a NAND response by receiving the outputs of the output terminals Q1, Q2, Q3 of the T-type flip-flops 210-5, 210-4, 210-3, NOR gates NOR11, NOR 12, NOR13, NOR14 for generating a NOR response by receiving through one input terminal the output of the NAND gate ND20 and through the other input terminal the outputs of the NAND gates ND15, ..., ND18, and inverters i42, I43, I44, 145 connected to the respective output terminals of the NOR gates NOR11, ..., NOR14.

Referring to FIG. 4, the T-flip-flop 210-I in FIG. 3 comprises a PMOS transistor PM1 for supplying an electric power to a drain terminal in response to a reset bar signal RESETB; a NMOS transistor NM1 for applying the voltage of the drain terminal of the PMOS transistor PM1 to an earth in response to a set signal SET; an exclusive OR gate for exclusively ORing an output of an output terminal Q and a signal Ti selected from the signals T, T2, T3, T4, T5 as shown in FIG. 3; a CMOS transmitting gate (transmission gate) MPG1 transmitting the output of the exclusive OR-gate XOR in accordance with a logic of the transmission control signal pair KK, KKB; an inverter latch LA1 for outputting and latching the output of the transmission gate MPG1; an inverter 120 for inverting an output of an inverter INV1 in the latch LA1; an transmission gate MPG2 transmitting the output of the inverter I20 in accordance with a logic of the transmission control signal pair KK, KKB; an inverter latch LA2 for latching and outputting the output of the transmission gate MPG2; an inverter I21 inverting the output of the latch LA2 to output it to the output terminal Q; an inverter IN10 for inverting the set signal SET; a NAND gate NAN1 for receiving and NAND-gating 3 the output of the inverter IN10, the reset bar signal RESETB and the output K of the inverter I30 in FIG. 3; an inverter IN11 for inverting the output of the NAND gate NAN1 to output a control signal KK among the transmission control signal pair KK, KKB; and an inverter IN12 for inverting the output of the inverter IN11 to output the control signal KKB among the control signal pair KK, KKB.

Figure 5:
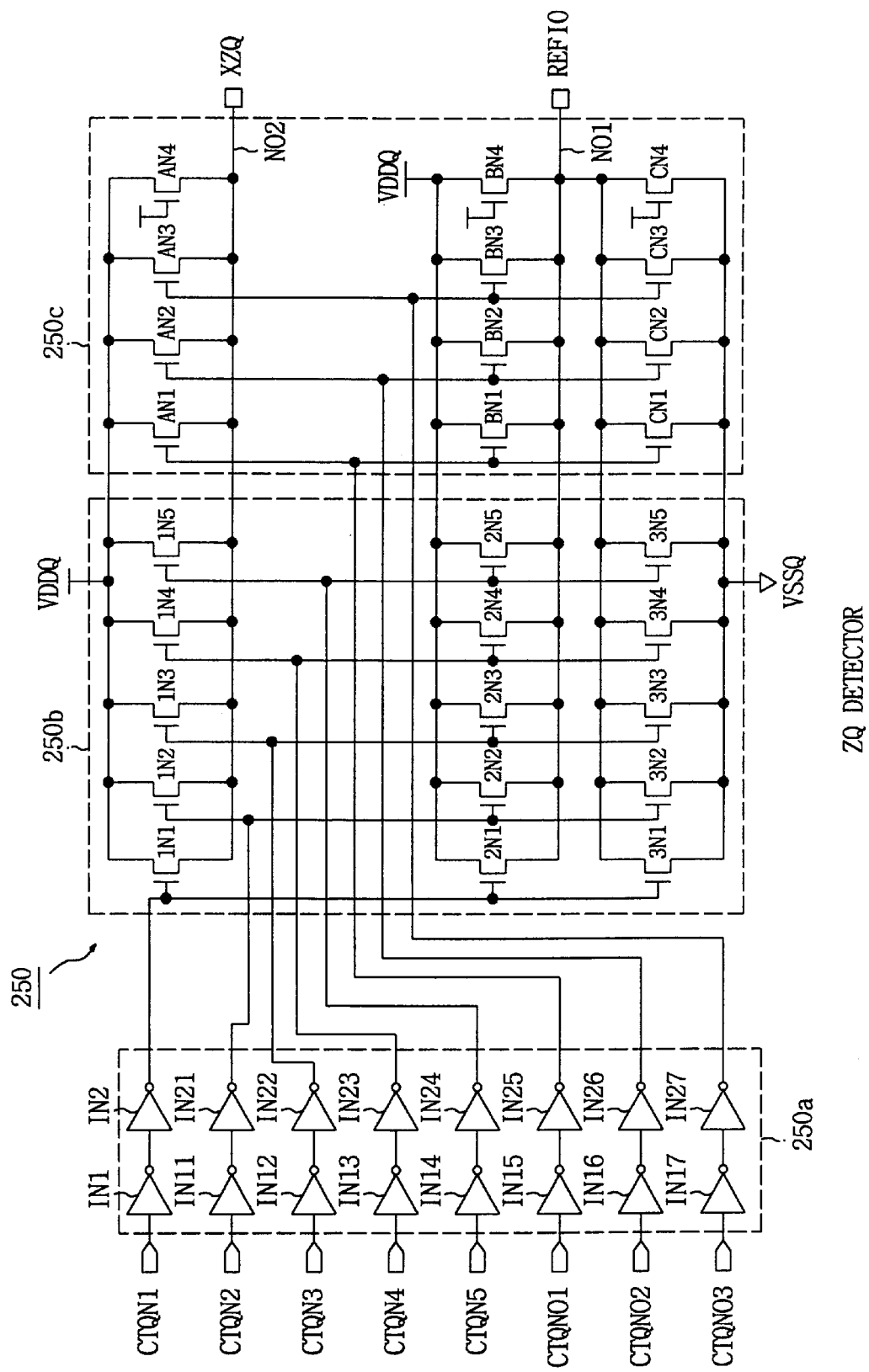
FIG. 5 is a circuit diagram for illustrating an embodiment of the ZQ detector shown in FIG. 2.

The impedance ZQ detector 250 included in the impedance detection, comparison and adjustment part, in the event that its structure is provided as shown in FIG. 5 in order to output the pad voltage XZQ and the array reference voltage REFIO as a first reference voltage, has a transistor array responding to the first control code data CTQN1, ..., CTQN5 through an array driving part 250a and an offset transistor array 250c responding to the second control code data CTQNO1, ..., CTQNO3. In FIG. 5, the array driving part 250a comprises inverters IN1, IN11, IN12, IN13, IN14 for receiving and inverting by one bit the first control code data CTQN1, ..., CTQN5; inverters IN2, IN21, IN22, IN23, IN24 for inverting the outputs of the inverters IN1, IN11, IN12, IN13, IN14; inverters IN15, IN16, IN17 for receiving and inverting by one bit the second control code data CTQNO1, ..., CTQNO3; and inverters IN25, IN26, IN27 for inverting the outputs of the inverters IN15, IN16, IN17. The transistor array 250b includes NMOS transistors 1N1, 1N2, 1N3, 1N4, 1N5 which its drain terminals are connected to driving supply voltage VDDQ, its source terminals are connected to the second common node NO2, and are turned on/off in response to the first control code data CTQN1, ..., CTQN5 applied to the gate terminals respectively to determine a level of the pad voltage XZQ in the second common node NO2, and NMOS transistor pairs 2N1, 3N1, 2N2, 3N2, 2N3, 3N3, 2N4, 3N4, 2N5, 3N5 which are arranged in symmetry from the common node NO1 connected to its source terminals and drain terminals connected to driving supply voltage VDDQ and ground voltage VSSQ respectively and are turned on or off in response to the first control code data CTQN1, ..., CTQN5 applied to the respective gate terminals to determine levels of the first reference voltage REFIO in the first common node NO1. The offset transistor array 250c includes offset NMOS transistors AN1, AN2, AN3 which its drain terminals are connected to driving supply voltage VDDQ, its source terminals are connected to the second common node NO2, and are turned on or off in response to the second control code data CTQNO1, CTQNO2, CTQNO3 applied to the gate terminals respectively to compensate levels of the pad voltage XZQ in the second common node NO2, and offset NMOS transistor pairs BN1, CN1, BN2, CN2, BN3, CN3, which are symmetrically arranged with reference to the common node NO1 connected to its source terminals and drain terminals connected to driving supply voltage VDDQ and ground voltage VSSQ respectively and are turned on or off in response to the second control code data CTQNO1, CTQNO2, CTQNO3 applied to the respective gate terminals to thereby compensate levels of the first reference voltage REFIO in the first common node NO1. Among the first and second comparator 350, 351, the first comparator 350 compares the first reference voltage REFIO and the pad voltage XZQ to output the first up-down control signal ZQUDB and the second comparator 351 compares one selected from the first reference voltage REFIO and pad voltage XZQ and a second reference voltage outputted by a resistant voltage divider DIV to output a second up-down control signal ZQUDBO.

Figure 6:
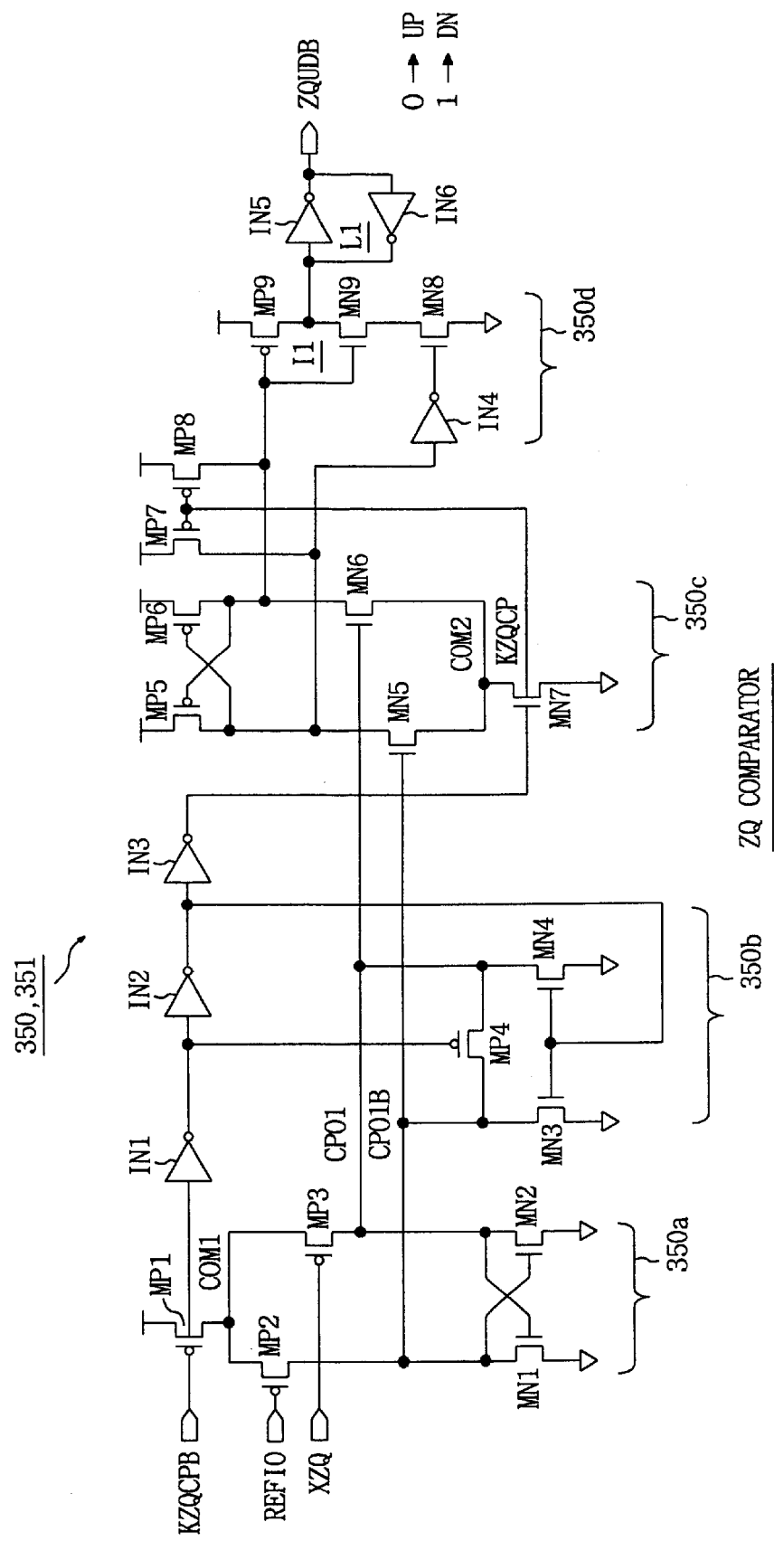
FIG. 6 is a circuit diagram for illustrating an embodiment of the first or second comparator shown in FIG. 2.

FIG. 6 is a detailed circuit diagram showing an embodiment of the first comparator 350. In the event that the circuit shown in FIG. 6 is used as the second comparator 351, an input of the first reference voltage REFIO is replaced with an input of the second reference voltage REF, and an input of the pad voltage XZQ is replaced with an input of the first reference voltage REFIO or an input of the pad voltage XZQ in response to an output of the multiplexer 300. In the event that the circuit shown in FIG. 6 is used as the first comparator 350, the circuit comprises a P-channel input-type cross coupled differential amplifier 350a having PMOS transistors MP2, MPO3 and NMOS transistors MN1, MN2 to amplify the level difference between the first reference voltage REFIO and the pad voltage XZQ, a N-channel input-type cross coupled differential amplifier 350c having PMOS transistors MP5, MP6 and NMOS transistors MN5, MN6 to receive the output voltages CPO1, CPO1B outputted from the output line pair of the P channel input-type cross coupled differential amplifier 350a and to again amplify the level difference, an output inverter 350d having N-type and PMOS transistors MP9, MN9 to output a level-determined voltage by inverting the output voltage outputted to one of output lines of the N-channel input-type cross coupled differential amplifier 350c, an inverter latch L1 for outputting the result of inverting in the output inverter 350d as the first up/down control signal ZQUDB and for continuously latching the inverting result until the output state of the output inverter is shifted, and a pre-charge and equalizer 350b having PMOS and NMOS transistors MP4, MN3, MN4.

Figure 7:
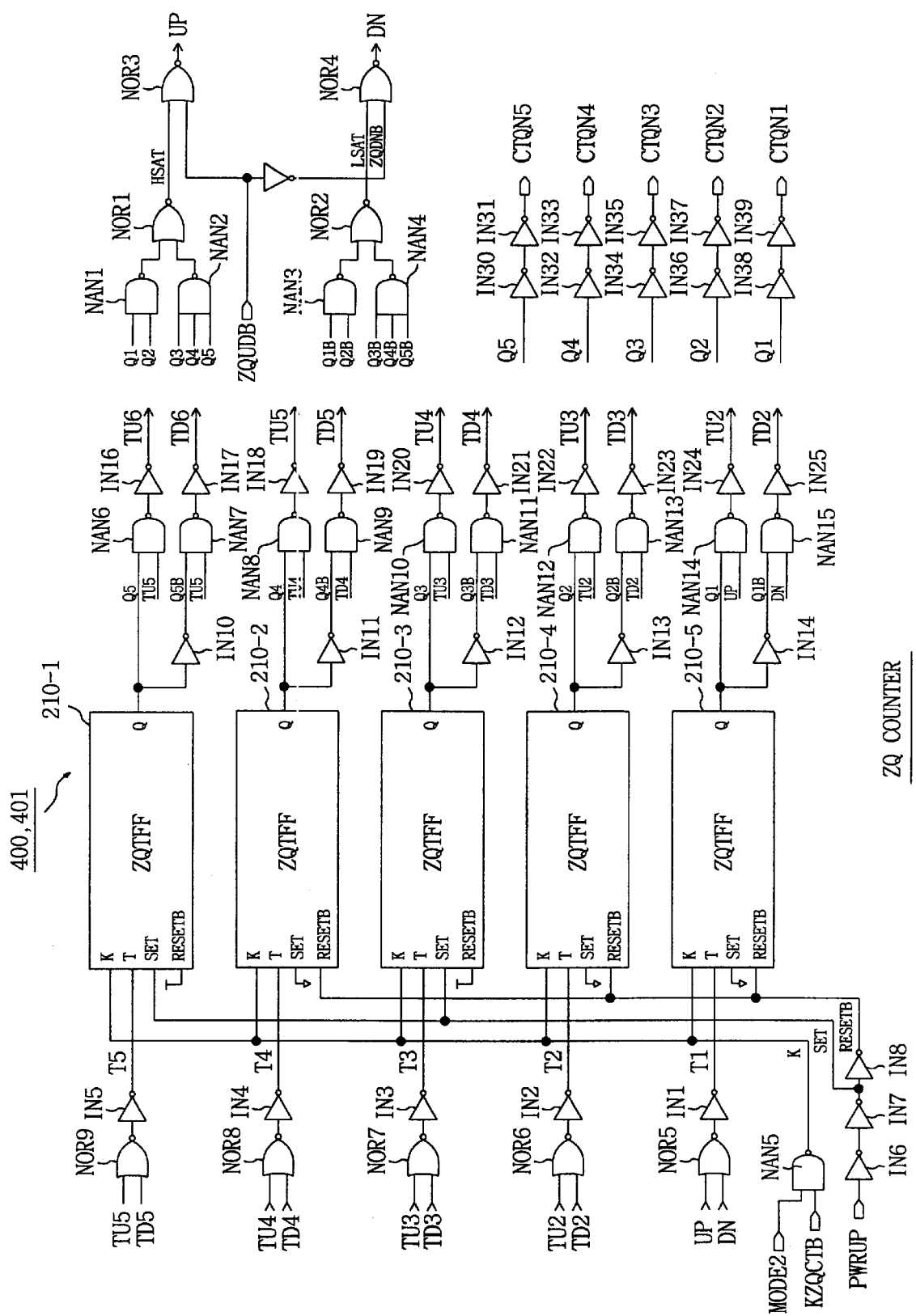
FIG. 7 is a circuit diagram for illustrating an embodiment of the first or second counter shown in FIG. 2.

Among the first and second counters 400, 401 included in the impedance detection, comparison and adjustment part, the first counter 400 performs an up/down counting in response to the state of the first up/down control signal ZQUDB to generate the first control code data CTQN1, ..., CTQN5 to operate the transistors within the transistor array, and the second counter 401 performs an up/down counting in response to the state of the second up/down control signal ZQUDBO to generate the second control code data CTQNO1, ..., CTQNO3 to operate the transistors within the offset transistor array. FIG. 7 is a detailed circuit diagram showing an embodiment of the first counter 400. In the event that the circuit shown in FIG. 7 is used as the second counter 401, the higher 2 stages among 5 stages are removed and 3 stages only are embodied. In case that the circuit in FIG. 7 is used as the first counter 400, the structure comprises a logic combination part having a plurality of logic gates NAN1, NAN2, NAN3, NAN4, NOR1, NOR2, NOR3, NOR4 to perform logic combination of the first up/down control signal and the first control code generated in the previous cycle to thereby generate the up/down counting signal, and a plurality of T-type flip-flops 2101, ..., 210-5 connected in series each other for receiving the up/down counting signal UP, DN through trigger input terminals to perform an up/down counting, thereafter outputting data of the first control code to each of the counting terminals. Where, each of the internal structure of the T-type flip-flops 210-1, ..., 210-5 can be constructed in the same structure as that shown in FIG. 4. In FIG. 7, the NAND gate NAN5 performs NAND-gating of the control clock KZQCTB of the clock generator 200 and the second mode control signal MODE2 to provide the resultant data to the control signal input terminals K of the T-type flip-flops 210-1, ..., 210-5.

Among the first and second higher code selectors 450, 451 included in the impedance detection, comparison and adjustment part, the first higher code selector 450 serves to latch the first control code data CTQN1, ..., CTQN5 to set a higher control code data as a final value when level of the pad voltage XZQ crosses the level of the first reference voltage REFIO in a normal operation mode and selects the first control code data CTQD1, ..., CTQD5 having a higher code value by comparing the first control code data CTQN1, ..., CTQN5 which are provided in a following latch cycle. The second higher code selector 451 serves to latch the second control code data CTQNOQ, ..., CTQNO3 to set a higher control code data as a final value when voltage level selected from the pad voltage XZQ and first reference voltage REFIO crosses the level of the second reference voltage REF in a compensating operation mode and selects the second control code data CTQD1, ..., CTQD3 having a higher code value by comparing the second control code data CTQNO1, ..., CTQNO3 which are provided in a following latch cycle.

Figure 8:
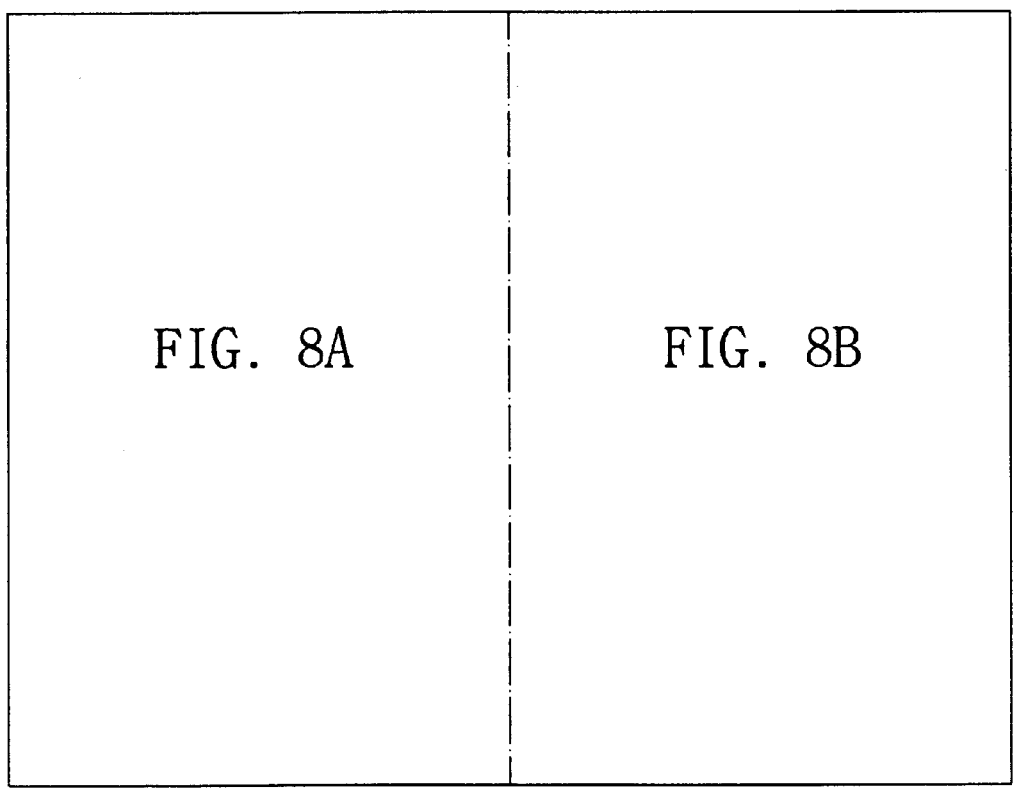
FIGS. 8A and 8B are circuit diagrams showing embodiments of the first and second higher code selector shown in FIG. 2.
Figure 8A:
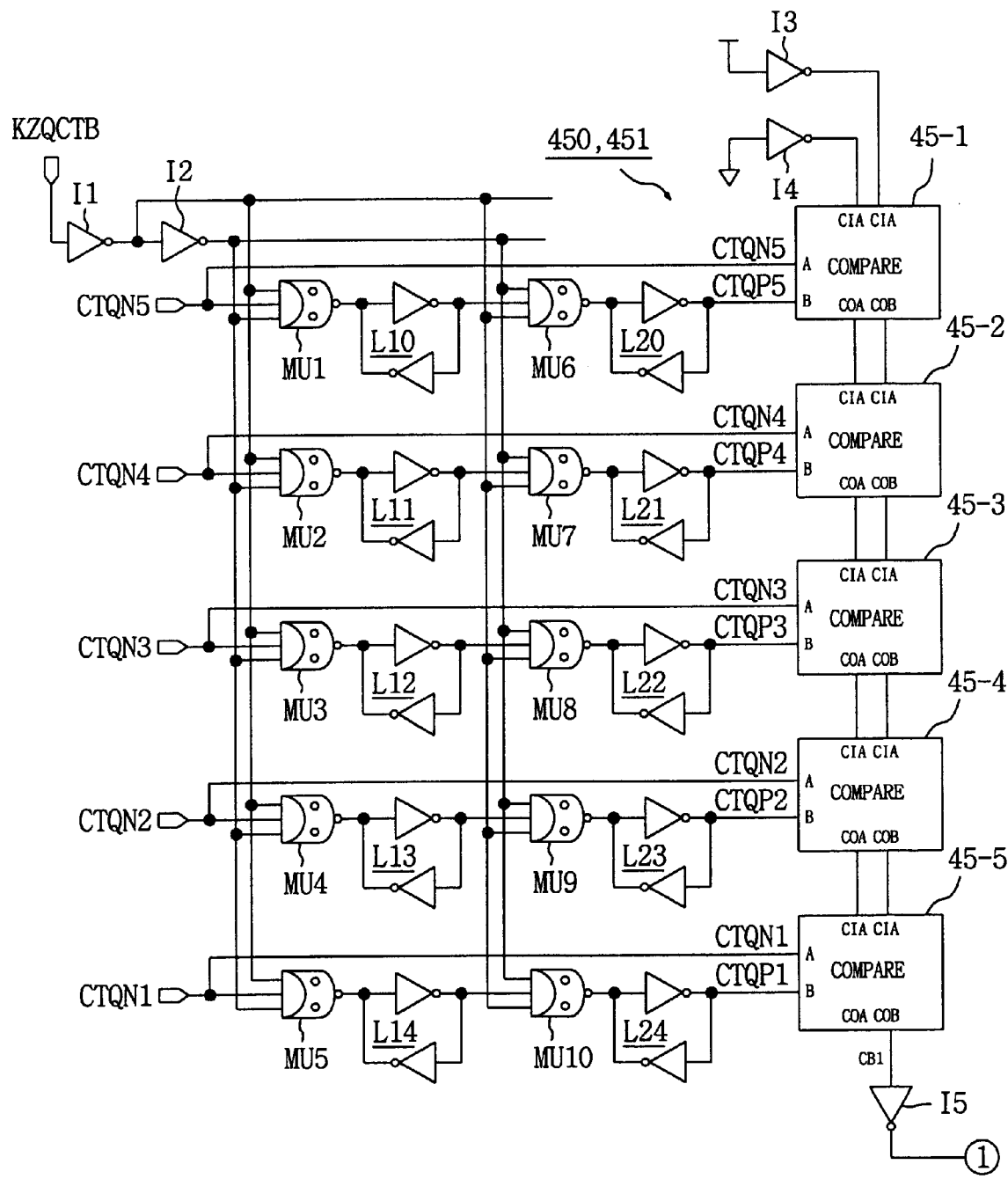
Figure 8B:
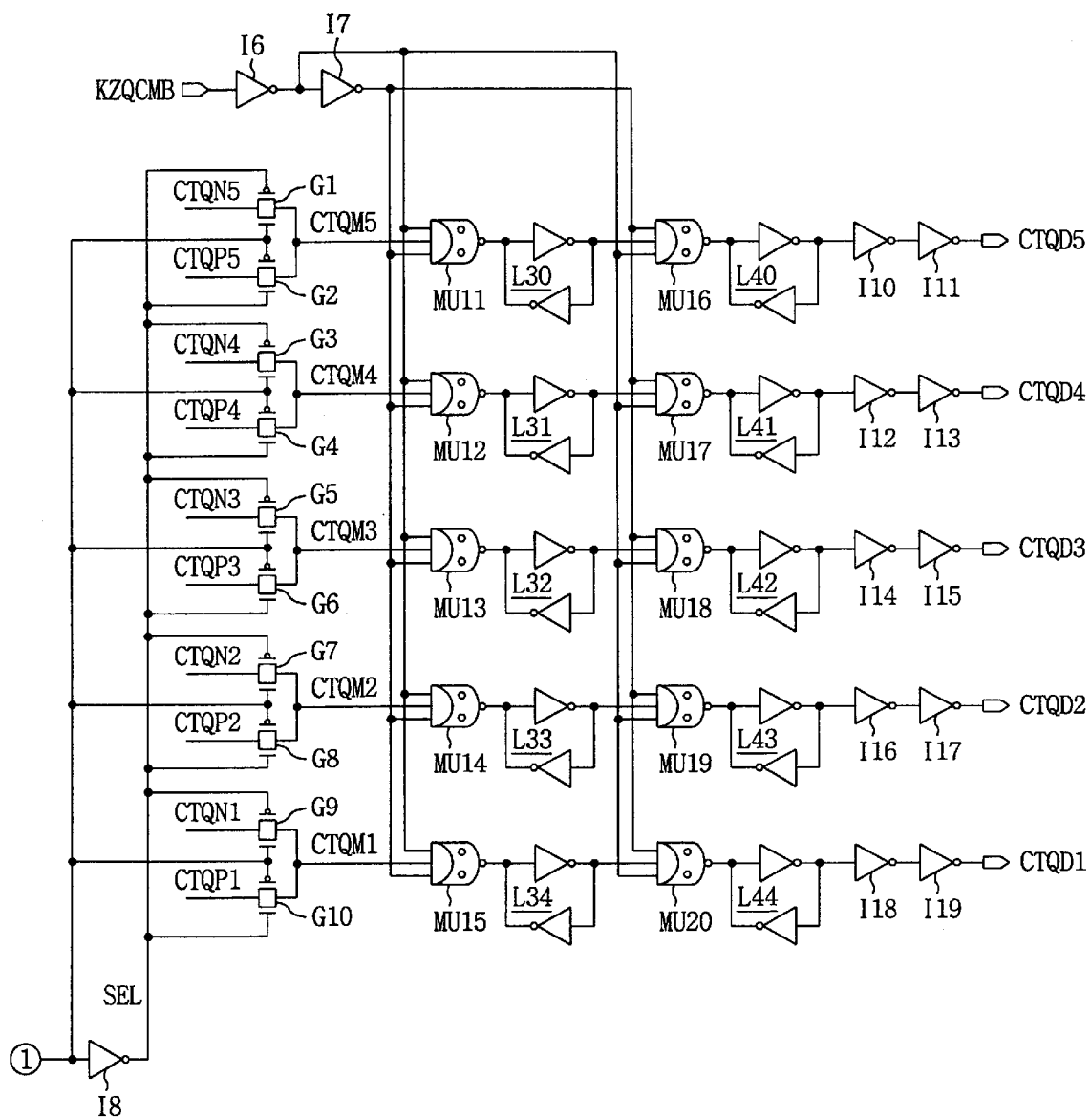

The detailed circuit diagrams illustrating embodiments of the first and second higher code selectors 450, 451 are shown in FIGS. 8A and 8B belonging to FIG. 8. In case that the circuit shown in FIG. 8 is used as the first higher code selector 450, it is constructed with: a selection signal generating part having transmission gates comparing parts 45-1~45-5 that generate a selection signal SEL by comparing the output data repetitively latched with the first control code data CTQN1~CTQN5 and currently shifting ones CTQN1~CTQN5 according to the first and second logics; and a selection output part for selecting and repetitively latching the first control code data having a higher code value among the output data repetitively latched with the first control code data CTQN1~CTQN5 and currently shifting ones CTQN1~CTQN5 in response to a selection signal SEL of the selection signal generating part and outputting them as the renewed first control code data CTQD1~CTQD5. In FIG. 8A, the selection signal generating part comprises: an inverter I1 for inverting the logic level of a clock control signal KZQCTB; another inverter I2 for inverting the output of the inverter I1; CMOS clocked inverters MU1~MU5 with each of their input terminals thereof being correspondingly connected with each bit of the first control code data CTQN1~CTQN5 and with the clock terminals thereof being connected with the output terminals of the inverters I1,I2; latches L10~L14 respectively connected with the output terminals of the clocked inverters MU1~MU5 for respectively latching the corresponding outputs; CMOS clocked inverters MU6~MU10 with the input terminals being connected with the outputs of the latches L10~L14 and with the clock terminals thereof being connected with the output terminals of the inverters I1,I2; latches L20~L24 connected with the output terminals of the clocked inverters MU6~MU10 MU6~MU10 for respectively latching the corresponding outputs; transmission gate comparison parts 45-1~45-5 for respectively receiving the outputs of the latches L20~L24 with terminals (B) and receiving the corresponding bits of the first control code data CTQN1~CTQN5 with terminals A to generate resultant signals resulting from the comparison that has been made according to the first and second logics generated by the inverters I3, I4 as a selection signal SEL; an inverter I5 for inverting the output of the output terminal COB of the transmission gate comparison part 45-5; and an inverter (I8 shown in FIG. 8B) for inverting the output of the inverter I5. At this time, the CMOS clocked inverters MU1~MU10 can be replaced with the structure connected with CMOS transmission gates and inverters. The transmission gates are often called multiplexers. The selection output part shown in FIG. 8B is constructed with CMOS transmission gates G1~G10 for providing the output logic level of the corresponding bits of the first control code data CTQN1~CTQN5 or the corresponding logic levels of the latches L20~L24 to be respectively received with the input terminals thereof according to the outputs of the inverters I5,I8, an inverter I6 for inverting the logic level of the clock control signal KZQCMB, an inverter I7 for inverting the output of the inverter i6, CMOS clocked inverters MU11~MU15 with the input terminals thereof being respectively connected with each bit of the output data CTQM1~CTQM5 passed through the CMOS transmission gates G1~G10 and with the clock terminals thereof being connected with the output terminals of the inverters I6,I7, latches L30~L34 respectively connected with the output terminals of the clocked inverters MU11~MU15 for latching the corresponding outputs, CMOS clocked inverters MU16~MU20 with the input terminals thereof being connected with the latches L30~L34 and with the clock terminals being with the output terminals of the inverters I6,I7, latches L40~L44 connected with the output terminals of the clocked inverters MU16~MU20 for respectively latching the corresponding outputs, inverters I10,I12,I14,I16,I18 for inverting the outputs of the latches L40~L44, and outputting inverters I11,I13,I15,I17,I19 for respectively inverting the outputs of the I10,I12,I14,I16,I18. The inverters I11,I13,I15,I17,I19 outputs the renewed first control code data CTQD1~CTQD5. In FIG. 8, each of the transmission gate comparison parts 45-1~45-5 can be constructed in the structure shown in FIG. 9. FIG. 9 is a detailed circuit diagram for illustrating an embodiment of a ZQ comparison part 45-i, that is, one of the transmission gate comparison parts, being constructed in the structure having connection of inverters IN1~IN4 and a plurality of CMOS transmission gates PG1~PG8. The detailed description about operations of the circuit shown in FIG. 9 has been disclosed in FIG. 4 and the accompanying specification registered as Korean Patent No. 98-18021 previously applied by the same inventor on May 19, 1998.

Figure 10:
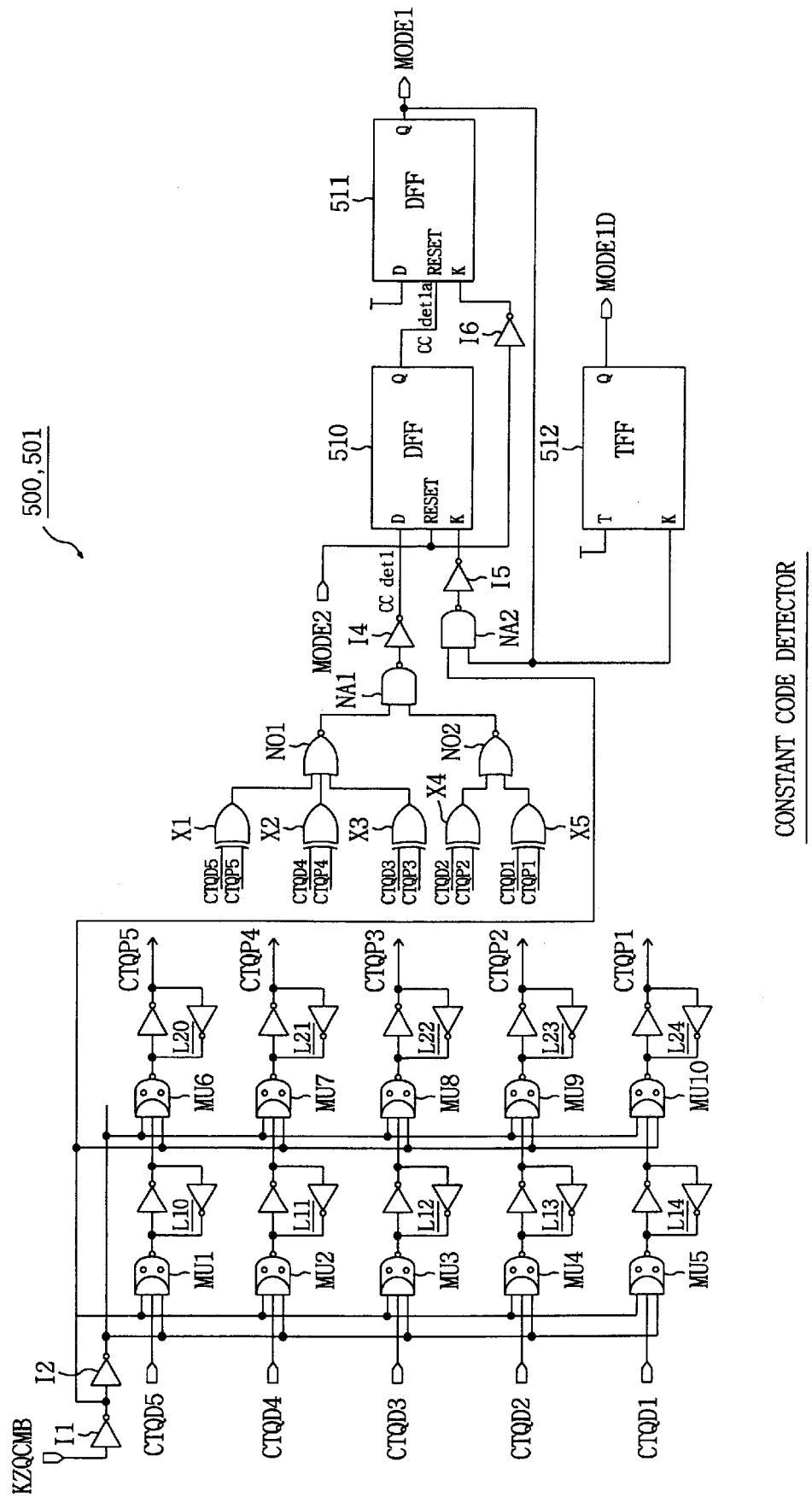
FIG. 10 is a circuit diagram for illustrating an embodiment of the first and second constant code detectors shown in FIG. 2.

The first and second constant code detectors 500,501 having constant code detecting parts included in the impedance detection, comparison and adjustment part are enabled alternately by respectively operating in response to the first and second control code data CTQD1~CTQD5, CTQD~CTQD3 selected by the higher code selector. Then, the first and second constant code detectors 500,501 generate mode control signals (MODE1,MODE2,MODE1D to perform normal operation mode, in which the first reference voltage REFIO and pad voltage XZQ resulting from the constant code detection process of the detecting parts are to be compared, and reset operation mode, in which the first reference voltage REFIO and pad voltage XZQ are selectively compared, and send them to the counting part. FIG. 10 is a detailed circuit diagram for illustrating an embodiment of the first and second constant code detectors 500,501. If the circuit shown in FIG. 10 is used as the first constant code detector 500, the circuit should comprise, at least, a latch and logic comparison and detection part for repetitively latching the first control code data CTQD1~CTQD5 selected by the higher code selector and comparing them with the currently shifted first control code data to detect a constant code and a flip-flop part for being reset in response to the first state of the second mode control signal MODE 2 and repetitively latching outputs of the comparison and detection part to generate the first mode control signal. Specifically, the first constant code detector 500 shown in FIG. 10 is constructed with an inverter I1 for inverting the logic level of the clock control signal KZQCMB, another inverter I2 for inverting an output of the inverter I1, CMOS clocked inverters MU1~MU5 with the input terminals thereof being respectively connected with bits of the first control code data CTQD1~CTQD5 and the clock terminals thereof being respectively connected with the output terminals of the inverters I1,I2, latches L10~L14 respectively connected with the output terminals of the clocked inverters MU1~MU5 for latching corresponding outputs, CMOS clocked inverters MU6~MU10 with the input terminals being connected with the outputs of the latches L10~L14 and with the clock terminals thereof being connected with output terminals of the inverters I1,I2; latches L20~L24 connected with the output terminals of the clocked inverters MU6~MU10 for respectively latching the corresponding outputs; exclusive OR gates X1~X5 for receiving the outputs CTQP1~CTQP5 of the latches L20~L24 and the first control code data CTQD1~CTQD5 in their corresponding bits and generating an exclusive OR response, a NOR gate NO1 for receiving the outputs of the exclusive OR gates X1~X3 to generate a NOR gating response, another NOR gate NO2 for receiving the outputs of the exclusive OR gates X4,X5 to generate a NOR gating response, a NAND gate NA1 for receiving the outputs of the NOR gates NO1,NO2 to generate a NAND response, an inverter I4 for inverting the output of the NAND gate NA1, another NAND gate NA2 connected an input of the one side thereof with the output of the inverter I1, an inverter I5 for inverting the output of the NAND gate NA2, a D type flip-flop 510 for receiving an output of the inverter I4 with the input terminal thereof, an output of the inverter I5 with the clock terminal and the second mode control signal MODE2 with the reset end RESET thereof, another D type flip-flop 511 with the reset end thereof being connected with the output terminal Q of the D type flip-flop 510, the input terminal thereof being fixed at the level of the power voltage and the clock terminal thereof being connected with the output of the inverter I6 which inverts the second mode control signal MODE2 for generating the first mode control signal MODE1 to the output terminal Q, and a T type flip-flop 512 with a toggle input terminal T thereof being fixed at the level of the power voltage for receiving the first mode control signal MODE1 with the clock terminal K for generating the mode control signal MODE1D to the output terminal Q. Similarly, if the circuit shown in FIG. 10 is utilized as the second constant code detector 501, there may be a slight difference in its structure. In other words, in the drawing, the structure of the circuit has no T-type flip-flop 512 and three levels with omission of two levels out of the five levels because inputting data. In addition, as shown in the drawing, the first mode control signal MODE1 is transmitted to the part where the second mode control signal MODE2 is to be input, and the output of the flip-flop 511 is known to be the second mode control signal MODE2.

Figure 11:
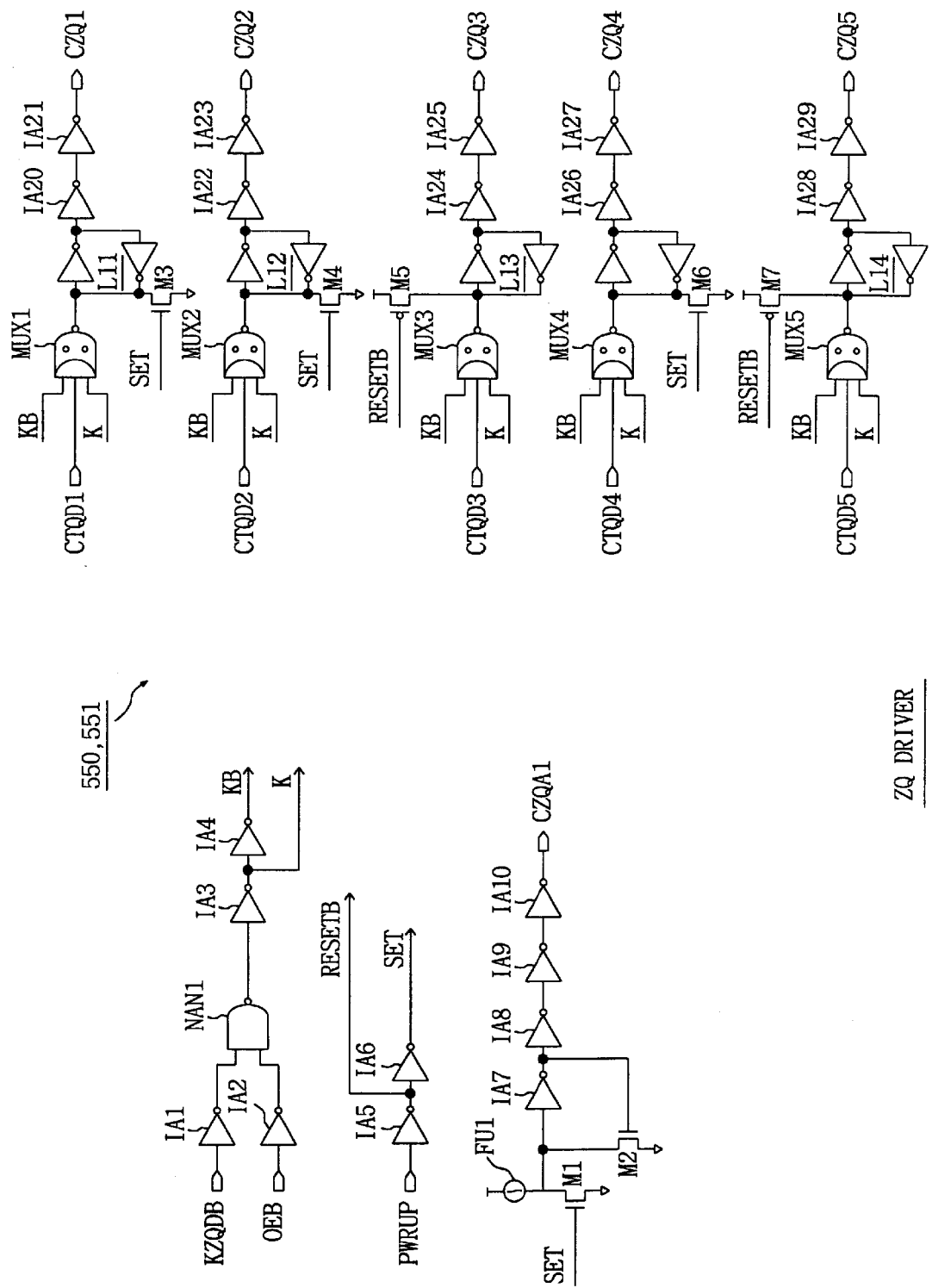
FIG. 11 is a circuit diagram for illustrating embodiments of the few and second drivers shown in FIG. 2.

The first and second drivers 550,551 are included in driving and data outputting part, constructing the impedance driver part. The first driver 550 generates normal buffer driving codes CZQ1~CZQ5, CZQA1 in response to the first control code data CTQD1~CTQD5 selected in the higher code selector. And the second driver 551 generates offset buffer codes CZQ1~CZQ3 in response to the second control code data CTQD1~CTQD3 selected in the higher code selector. FIG. 11 is a detailed circuit diagram for illustrating an embodiment of the first and second drivers 550,551. If the circuit shown in FIG. 11 is utilized as the first impedance driver 550, the circuit should include: transmission parts MUX1~MUX5 for transmitting the first control code data CTQD1~CTQD5 output from the first higher code selector according to combination signals KB,K logically combined with an output enable bar signal OEB and a driver control clock KZQDB; and latch and output parts L11~L14 for generating the normal buffer driving codes by latching and outputting the outputs of the transmission parts MUX1~MUX5. Besides, the driver 550 comprises a plurality of inverters IA1~IA10,IA20~IA29, a fuse FU1, NMOS transistors M1,M2.

Figure 12:
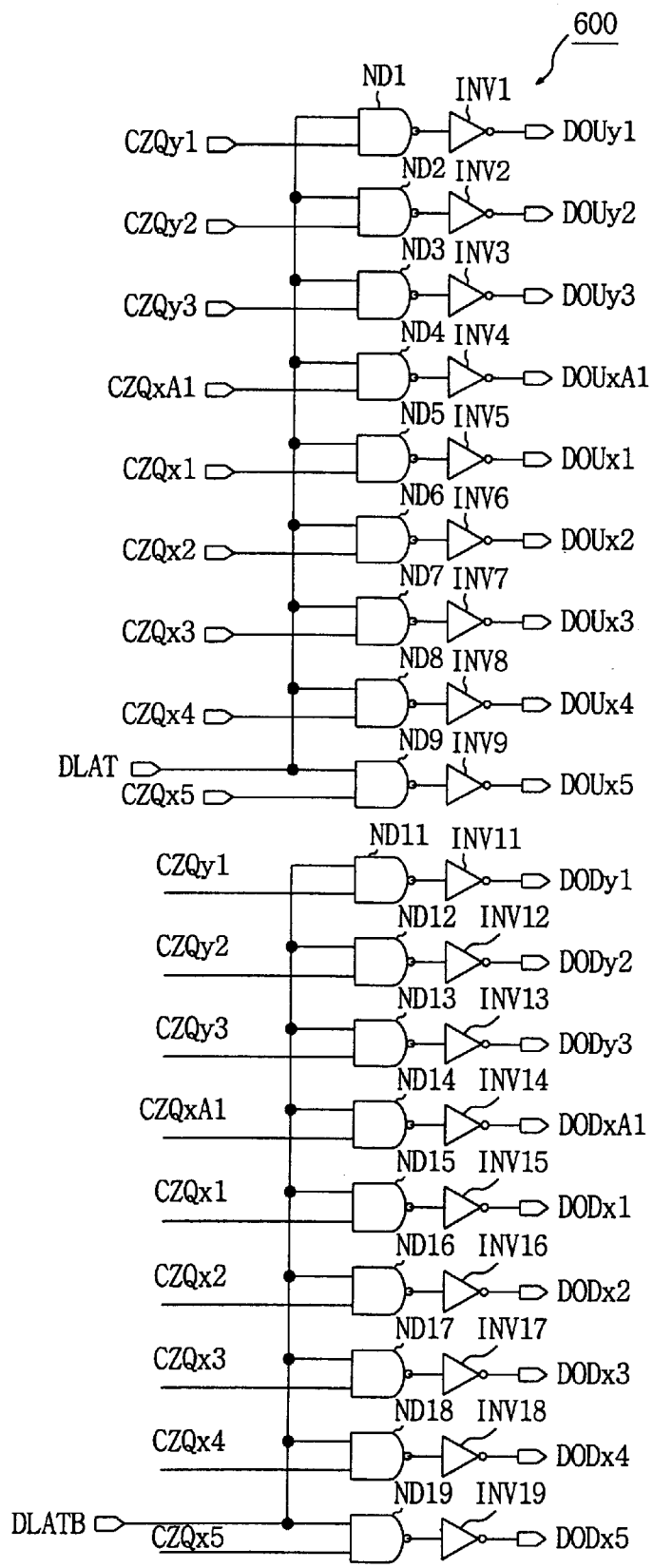
FIG. 12 is a circuit diagram for illustrating an embodiment of the output bufer shown in FIG. 2.

FIG. 12 is a detailed circuit diagram for illustrating an embodiment of the data output buffer 600 included in the driving and data outputting part. In the structure of the circuit shown in FIG. 12 there should be a plurality of unit output buffer members ND1~ND19 to be selectively enabled according to each bit status of normal buffer driving codes CZQx1~CZQx5,CZQAx1 and offset buffer driving codes CZQy1~CZQy3. In FIG. 12, the data output buffer 600 comprises pull-up unit output buffer members ND1~ND9 for respectively generating NAND responses by receiving a bit corresponding to one of the normal buffer driving codes CZQx1~CZQx5,CZQAx1, a bit corresponding to the offset buffer driving codes CZQy1~CZQy3 and one DLAT out of pairs of the memory cell data DLAT, DLATB, pull-up inverter members INV1~INV9 respectively connected with the output terminals of the pull-up unit output buffer members for performing inversions, pull-down unit output buffer members ND11~ND19 for respectively generating NAND responses by receiving a bit corresponding to any of the normal buffer driving codes CZQx1~CZQx5,CZQAx1, a bit corresponding to any of the offset buffer driving codes CZQy1~CZQy3 and one DLATB out of the remaining pairs of the memory cell data DLAT, DLATB, and pull-down inverter members INV11~INV19 respectively connected to the output terminals of the pull-down unit output buffer members ND11~ND19 for performing inversions. It should be understood that the structure connecting the NAND gates and inverters shown in FIG. 12 can be replaced with AND gates. Only the unit output buffers to be enabled in the data output buffer 600 receive and buffer pairs of memory cell data to be output as pull-up and pull-down output data DOUx1~DOUx5, DODx1~DODx5, DOUxA1 and offset pull-up and pull-down output data DOUy1~DOUy3, DODy1~DODy3, DODxA1.

Figure 13:
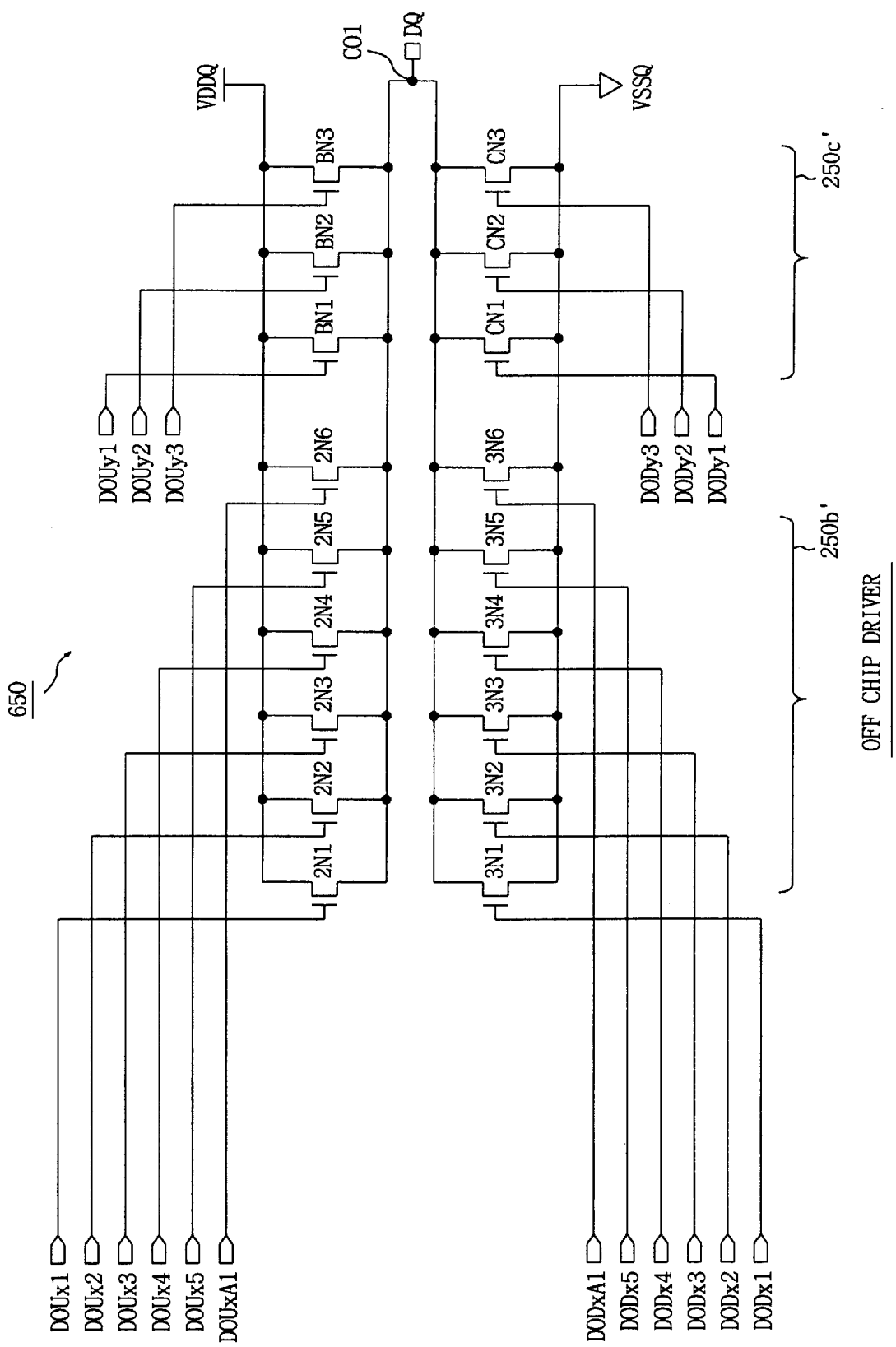
FIG. 13 is a circuit diagram for illustrating an embodiment of the off-chip driver shown in FIG. 2.

If an off-chip driver 650 included in the driving and data outputting part is constructed as shown in FIG. 13, there are transistor array 250b' and offset transistor array 250c' having a plurality of transistors arranged in symmetry. The off-chip driver 650 generates output data impedance-matched to array common node CO1 by respectively turning on the transistors of the array in response to the state of each type of output data and provides them outside through an output pad DQ connected to the array common node CO1.

In FIG. 13, transistors of the transistor array 250b' are arranged in symmetry from the output common node CO1 commonly connecting source and drain terminals. Both of the source and drain terminals comprise symmetrical pairs of NMOS transistors 2N1,3N1,2N2,3N2,2N3,3N3,2N4, 3N4,2N5,3N5 respectively connected to supply voltage VDDQ and ground voltage VSSQ with various driving capacities to set a level of the output data at the output common node by being turned on/off in response to the pull-up and pull-down output data respectively transmitted to the gate terminals. Transistors of the offset transistor array 250c' are arranged in symmetry from the output common node CO1 commonly connecting source terminals and drain terminals. Both of the source and drain terminals comprise pairs of offset NMOS transistors BN1,CN1,BN2,CN2,BN3, CN3 respectively connected in symmetry to supply voltage VDDQ and ground voltage VSSQ for resetting the level of the output data in the output common node by being turned on/off in response to the offset pull-up and pull-down output data respectively transmitted to the gate terminals.

The multiplexer 300 shown in FIG. 2A selects either the pad voltage XZQ or the first reference voltage REFIO according to the level of the mode control signal MODE1D to transmit to the second comparator 351, thereby comprising combination of gates or transmission gates.

FIG. 14 illustrates a wave form view of mode signals respectively output from the flip-flops shown in FIG. 10. FIG. 15 illustrates a shifting wave form view of voltage levels relating to the impedance matching shown to explain the principle of an automatic reset operation in accordance with the impedance control method of the present invention.

Hereinafter, a preferred impedance matching and reset operation will be described in accordance with the structure of the aforementioned embodiment. First of all, the normal code operational steps will be described. A matching external resistance RZQ having a voltage value approximately five times as high as the impedance value of an external apparatus is connected between the extra pad and ground connected to an node NO2 in an impedance detector 250. The level of the first reference voltage REFIO in the common node NO1 shown in FIG. 5 is previously set at half of the supply voltage VDDQ/2 as in the prior art described above.

However, if there are variances in supply voltage, operational temperature, manufacturing processes and property of the transistors shown in FIG. 5, the level of the first reference voltage REFIO can not be set at half of the supply voltage VDDQ/2 or may be lower than half of the supply voltage VDDQ12 as shown by dashed lines in an interval TU1 of FIG. 15. Alternatively, the level of the first reference voltage REFIO may be higher than half of the supply voltage VDDQ/2. Even if the level of the first reference voltage REFIO is not exactly half of the supply voltage VDDQ/2. the pad voltage VZQ and the array reference voltage, that is, the first reference voltage REFIO, are compared in the normal code operational step. As a result, the pad voltage VZQ tracks the array reference voltage REFIO. Accordingly, an impedance driving process is performed to the data output terminals DQ in the off-chip driver 650 The normal code operational step shown in the interval TU1 of FIG. 15 relates to the case that the pad voltage VZQ is higher than the first reference voltage REFIO. At this time, the first comparator 350 outputs the first DOWN control signal and the first counter 400 performs down-counting, thereby turning off any corresponding transistor of the transistors IN1~IN5 in the impedance detector 250. Therefore, the pad voltage VZQ tracks tee array reference voltage REFIO. The normal code operational step is the same as in the prior art described above, except in that the normal code operation process is performed in the internal structure of the Impedance detector 250 and off-chip driver 650 constructed with NMOS transistors.

Importantly, after the pad voltage VZQ tracks the array reference voltage REFIO, if a normal constant code detection is made at the operational timing shown with an arrow symbol t2 in FIG. 14, the offset code operational step is performed in an interval TU2 of FIG. 15. When the pad voltage VZQ toggles up/down a level of array reference voltage REFIO, a normal constant code detection is made by the first constant code detector 500. Accordingly, the second constant code detector 501 is enabled to initiate the offset code operational step to perform a reset operation of the pad voltage VZQ or the first reference voltage REFIO. As shown with the timing arrow symbol t2 in FIG. 14, the first mode control signal MODE1 turns to logic "low", and the second mode control signal MODE2 tuns to logic "high". At this time, it is assumed that the multiplexer 300 shown in FIG. 2A was set to select the fist reference voltage REFIO out of the two inputs REFIO, VZQ Then. out of the reset operation modes in which the first reference voltage REFIO and the pad voltage XZQ arm selectively compared, a reset operation mode, in which the fist reference voltage REFIO is compared with the second reference voltage REF, is firstly performed to the second reference voltage REF set by a resistant voltage divider. As a result of the reset operation performed in the interval TU2 of FIG. 15, the first reference voltage REFIO tracks the second reference voltage REF. Accordingly, the impedance reset operation is performed to the data output terminal DQ in the off-chip driver 650. The offset code operational step shown in the interval TU2 of FIG. 15 relates to the case that the first reference voltage REFIO is lower than the second reference voltage REP. At this time, the second comparator 350 outputs the second UP control signal and the second counter 401 performs up-counting, thereby turning on any corresponding transistor out of the offset transistor BN1~BN3, CN1~CN3 in the impedance detector 250. Therefore, the first reference voltage REFIO tracks the second reference voltage REF. In other words, in order to prevent the case that the level of the first reference voltage REFIO is not precisely set at half of the supply voltage VDDQ/2 due to any variance in supply voltage, operational temperature, manufacturing processes or the like, a reset operation is performed because it is necessary to precisely reset the first reference voltage REFIO at half of the supply voltage. The level of the second reference voltage REF is set by only resistors R1 and R2 constructing the resistant voltage divider DIV, the level of the second reference voltage is more stable than that of the first reference voltage. In addition, if the resistors R1 and R have the same resistance value, the level of the reference voltage is precisely set at the half of the supply voltage in spite of variances in the supply voltage.

After the first reference voltage REFIO tracks the second reference voltage REF, if an offset constant code detection is made in the operational timing shown with the arrow symbol t3 in FIG. 14, the normal code operational step is performed again in the interval TU3 of FIG. 15. The offset constant code detection is performed by the second constant code detector 501 when the first reference voltage REFIO toggles up/down the level of the second reference voltage REF in the wave form shown in FIG. 15. Accordingly, the first constant code detector 500 is enabled, and the aforementioned normal code operational step is performed again for comparing the pad voltage VZQ and the array reference voltage, that is, the first reference voltage REFIO. As a result, the pad voltage VZQ tracks the array reference voltage REFIO readjusted by the reset operation. Accordingly, an impedance driving process of the output terminal DQ is performed in the off-chip driver 650, so that the output impedance is matched with the impedance of an external connection element. It should be noted that in the normal code operational step shown in the interval TU3 of FIG. 15 the pad voltage VZQ tracks the reset first reference voltage REFIO to be close to the level of the second reference voltage REF.

If the normal constant code detection is made in the operational timing shown with the arrow symbol t4 in FIG. 14, the offset code operational step is performed in the interval TU3, similarly to in the interval TU2 as shown in FIG. 15. According to the normal constant code detection operation, the second constant code detector 501 is enabled again to initiate an offset code operational step in which resetion is performed to the pad voltage VZQ or the first reference voltage REFIO. As shown with the timing arrow symbol t4 in FIG. 14, the first mode control signal MODE1 turns to logic "low" and the second mode control signal MODE2 turns to logic "high." At this time, the level of the mode control signal MODE1D turns to logic "low" in the interval TU2 of the wave form view shown in FIG. 14. At this time, the multiplexer 300 shown in FIG. 2A selectively outputs the pad voltage VZQ out of the two inputs, the first reference voltage REFIO and the pad voltage VZQ. Accordingly, the reset operation is performed for comparing the pad voltage VZQ, not first reference voltage REFIO, to the second reference voltage REF. As a result of the reset operation, the pad voltage VZQ tracks the second reference voltage REF to thereby initiate impedance resetion to the data output terminal DQ in the off-chip driver 650. The reset operation allows the pad voltage VZQ to track to the second reference voltage REF. In other words, the reset operation is made to avoid the worst case that a semiconductor device can not have a desired output impedance value within the specification of about 35~70 Ω due to variances in supply voltage, operational temperature, manufacturing processes or the like. At this time, the pad voltage VZQ turns on/off the offset transistors AN1,AN2,AN3 shown in FIG. 15.

In conclusion, according to the reset operation disclosed in the present invention, a constant reference voltage REF is selectively compared with array reference voltage or one of pad voltage for resetting the voltage level thereof. Then, the selected voltage tracks the constant reference voltage, and an impedance driving process of the data output terminal is performed for setting a desired output impedance value to the data output terminal.

Therefore, since the reset operation is automatically made in the present invention, there is no need to perform a reset for impedance matching by additionally making a control part having metal option, bonding option or fuse option and precisely adjusting the scope of reference level or resistance value for impedance matching with the control part in the prior art. Thus, the present invention is advantageous in solving the problems of requiring quite a long test and an additional process for a precise adjustment. Besides, instability in the output operation of data caused by the difficulty in stabilization of impedance matching is also solved in the present invention.

While the invention has been described with reference to the accompanying drawings in terms of a preferred embodiment, those skilled in the art will recognize that the invention can be practiced with various changes and modifications within the spirit and scope of the appended claims. For instance, the internal structure of the circuit block shown in FIG. 2 can be different or the functional circuit can be replaced with any other circuit device that performs an identical or similar function.

According to the present invention described above, the resetion of output impedance matching is automatically made in a semiconductor memory device like a semiconductor device, a static RAM and the like to achieve an effect of obtaining a desired output impedance irrespective of variances in supply voltage, operational temperature or manufacturing processes. In addition, there are advantages in the invention in that a control part having a metal option or a fuse option is not required and that no additional control process is performed for the impedance reset, to thereby improve performance of a semiconductor device and reduce manufacturing cost. Furthermore, in spite of a variance in supply voltage, an occurrence of impedance mismatching is prevented or minimized to make a progress in setup/hold failure of impedance matching, so that there is an advantage of stabilizing the output operation of data in a semiconductor device or a semiconductor memory device.

What is claimed is:

1. An impedance control output circuit of a semiconductor device, comprising:

an impedance detection, comparison, and adjustment part adapted to perform a first operation by comparing an array reference voltage with a pad voltage of a pad, the pad being connected to an external resistance, to thereby change the pad voltage such that it tracks the array reference voltage and adapted to perform a second operation by comparing the array reference voltage with a predetermined reference voltage generated by a resistant voltage divider and adapted to thereby change the array reference voltage such that it tracks the predetermined reference voltage; and a driving and data outputting part for driving an impedance of a data output terminal of the semiconductor device in response to the first and second operations.

2. The circuit, as defined in claim 1, wherein a resistance value of the external resistance is five times as great as that of an external data transmission line.

3. The circuit, as defined in claim 1, wherein the predetermined reference voltage is set at half of a supply voltage.

4. The circuit, as defined in claim 1, wherein the first and second operations are alternately performed.

5. The circuit, as defined in claim 1, wherein the driving and data outputting part is adapted to generate a plurality of control signals adapted to control a transistor and offset transistor array constructed in an off-chip driver of the semiconductor device.

6. The circuit, as defined in claim 5, wherein the transistor and offset transistor array are constructed in the same structure as those that provide pad voltage and the array reference voltage.

7. An impedance control output circuit of a semiconductor device, comprising:

an impedance detector having a transistor way adapted to respond to the first control code data and an offset transistor array adapted to respond to the second control code data, the impedance detector outputting a first reference voltage from a first common node of the transistor and offset transistor arrays and a pad voltage from a second common node of the transistor and offset transistor array;

a comparison part having:
 a first comparator adapted to output a first up/down control signal by comparing the first reference voltage to the pad voltage; and
 a second comparator adapted to output a second up/down control signal by comparing the first reference voltage to a second reference voltage, the second reference voltage output by a resistant voltage divider;

a counting part having:
 a first counter that performs an up/down counting in response to the first up/down control signal to thereby generate a first control code data for operating transistors of the transistor array; and
 a second counter that performs an up/down counting in response to the second up/down control signal to thereby generate a second control code data for operating transistors of the offset transistor array;

a higher code selector having a first higher code selector to select a first control code data having a higher code value by latching the first control code data and comparing it with a first control code data applied from the following latch cycle and a second higher code selector to select a second control code data having a higher code value by latching the second control code data and comparing it with a second control code data applied from the following latch cycle;

an impedance driving part having a first impedance driver to generate buffer driving codes in response to the fit control code data selected by the higher code selector and a second impedance driver to generate offset buffer driving codes in response to the second control code data selected by the higher code selector;

a data output buffer having a plurality of unit output buffers to be selectively enabled in response to respective bit states of the buffer driving codes and offset buffer driving codes for allowing only the unit output buffers to be enabled to receive and buffer pairs of memory cell data and outputting them as pull-up and pull-down output data and offset pull-up and pull-down output data;

an off-chip driver having transistor array and offset transistor array arranged in symmetry with a plurality of transistors for generating output data to an array common node by turning on transistors of an array respectively responding to a state of each type of output data and providing the impedance-matched output data through the output pad connected with the array common node; and a constant code detecting part having first and second constant code detectors for detecting constant codes in response to the first and second control code data selected by the higher code selector for generating mode control signals to alternately perform the first mode by which the first reference voltage and pad voltage are compared each other and the second mode by which the second reference voltage and the first reference voltage are compared each other.

8. The circuit, as defined in claim 7, wherein the transistor array includes a plurality of NMOS transistors with drain and source terminals being commonly connected to supply voltage and the second common node, the NMOS transistors having different driving capacities to set a level of pad voltage at the second common node by being turned on/off in response to the first control code data respectively applied to gate terminals and pairs of NMOS transistors arranged in symmetry from the first common node commonly connecting drain and source terminals to supply voltage and ground voltage, the transistors having different driving capacities to set a level of the first reference voltage at the first common node by being turned on/off in response to the first control code data respectively applied to gate terminals of the NMOS transistors; and wherein the offset transistor array includes a plurality of offset NMOS transistors with drain and source terminals being commonly connected to supply voltage and the second common node, the offset NMOS transistors having different driving capacities to reset a level of pad voltage at the second common node by being turned on/off in response to the second control code data respectively applied to gate terminals and pairs of offset NMOS transistors arranged in symmetry from the first common node commonly connecting drain and source terminals to supply voltage and ground voltage, the transistors having different driving capacities to reset a level of the first reference voltage at the first common node by being turned on/off in response to the second control code data respectively applied to gate terminals of the offset NMOS transistors.

9. The circuit, as defined in claim 8, wherein the first comparator includes:

a P-channel input-type cross coupled differential amplifier for amplifying a difference between levels of the first reference voltage and the pad voltage;

an N-channel input-type cross coupled differential amplifier for receiving an output voltage to be respectively provided to a pair of output lines of the P-channel input-type cross coupled differential amplifier and repetitively amplifying the difference between levels of the first reference voltage and pad voltage;

an output inverter for outputting a level of the output voltage by inverting the output voltage provided to one side of an output line of the N-channel input-type cross coupled differential amplifier; and an inverter latch for inverting an output of the output inverter and providing an inverting result as the first up/down control signal and continuously latching the inverted result until an output state of the output inverter is shifted.

10. The circuit, as defined in claim 9, wherein the first counter of the counting part includes:

a logic combination put for generating an up/down counting signal by logically combining the first control code data generated from the fit up/down control signal and the first control code data generated in the previous cycle; and a plurality of T-type flip-flops connected in series for performing an up/down counting by receiving the up/down counting signal of the logic combination part with a trigger input terminal and thereafter outputting the fist control code data to the counting output terminal.

11. The circuit as defined in claim 10, wherein the first higher code selector includes:

a selection signal generating part having a transmission gate comparing part by comparing the output data repetitively latched with the first control code data and a currently applied first control code data according to the first and second logic; and a selection and output part for selecting and repetitively latching the first control code data having a higher code value, the output data being respectively latched with the first control code data in response to the selection signal and the currently applied first control code data, and being output as the renewed first control code data.

12. The circuit, as defined in claim 11, wherein the first impedance driver includes:

transmission parts for respectively transmitting the first control code data output from the first higher code selector and a driver control clock according to an output enable bar signal and logically combined signals; and latch and output parts for generating the buffer driving codes by latching and outputting the output of the transmission parts.

13. The circuit, as defined in claim 12, wherein the data output buffer includes:

a pull-up unit output buffer members for generating a NAND response by receiving a corresponding bit of the buffer driving codes, a corresponding bit of the offset buffer driving codes and one of the pairs of memory cell data;

pull-up inverter members respectively connected with the output terminals of the pull-up unit output buffer members for performing an inversion;

pull-down unit output buffer members for respectively generating a NAND response by receiving a corresponding bit of the buffer driving codes, a corresponding bit of the offset buffer driving codes, and the other of the pairs of memory cell data; and pull-down inverter members respectively connected with the output terminals of the pull-down unit output buffer members for performing inversion.

14. The claim, as defined in claim 13, wherein the transistor array of the off-chip driver includes pairs of NMOS transistors arranged in symmetry from an output common node commonly connecting source and drain terminals which are respectively connected to supply voltage and ground voltage, the NMOS transistors having different driving capacities to set a level of output data at the output common node by being turned on/off in response to the pull-up and pull-down output data respectively applied to gate terminals; and wherein the offset transistor array of the offset driver includes pairs of offset NMOS transistors arranged in symmetry from an output common node commonly connecting source and drain terminals which are respectively connected to supply voltage and ground voltage, the offset transistors having different driving capacities to reset a level of output data at the output common node by being turned on/off in response to the offset pull-up and offset pull-down output data respectively applied to gate terminals.

15. The circuit, as defined in claim 14, wherein the first constant code detector includes:

a latch, logic comparison and detection part for respectively latching the first control code data selected by the higher code selector, comparing it with the currently applied first control code data and detection a constant code; and a first flip-flop part for being reset in response to a first state of the second mode control signal, for receiving and repetitively latching an output of the logic comparison detecting part, and for generating a first mode control signal; and wherein the second constant code detector includes:

a latch, logic comparison and detection part for repetitively latching the second control code data selected by the higher code selector, computing it with the currently applied second control code data, and detecting a constant code; and a second flip-flop part for being reset in response to the first state of the second mode control signal, for receiving and repetitively latching the output of the logic comparison detecting part, and for generating a second mode control signal.

16. An impedance control output circuit of a semiconductor device having an off-chip driver, the circuit comprising:

impedance detection, comparison and resetting means adapted to perform first and second operations, the first operation being performed by comparing a pad voltage of a pad connected with an external resistor to an array reference voltage to result in the pad voltage tracking the array reference voltage and the second operation being performed by comparing a constant reference voltage set up by a resistant voltage divider to reset the level of the pad voltage to the pad voltage to thereby result in the pad voltage tracking the constant reference voltage; and driving and data outputting means adapted to perform an impedance driving process of a data output terminal of the off-chip driver responsive to comparisons occurring in the impedance detection, comparison and resetting means and adapted to provide internal data to data output terminals.

17. The circuit, as defined in claim 16, wherein a resistance value of the external resistor is five times as great as that of the external semiconductor device.

18. The circuit, as defined in claim 17, wherein a level of the constant reference voltage is set at half of a supply voltage.

19. The circuit, as defined in claim 17, wherein the first and second operations are alternately performed.

20. The circuit, as defined in claim 17, wherein an impedance driving process of the data output teal is performed by selectively controlling transistors of a transistor array and an offset transistor array constructed in the off-chip driver of the semiconductor device.

21. The circuit, as defined in claim 17, wherein the transistor array and the offset transistor array arm constructed in the sane structure as those that provide the pad voltage and the array reference voltage.

22. A programmable impedance control output circuit of a semiconductor device having an off-chip driver that provides internal data through a data output terminal to an external element, the circuit comprising:
- an impedance detection, comparison and reset part for performing impedance match and offset reset operations by comparing a pad voltage of a pad connected with an external resistor to an array reference voltage resulting in the pad voltage tracking the array reference voltage and for selectively comparing a constant reference voltage set up by a resistant voltage divider with either the array reference voltage or the pad voltage to reset a level of the array reference voltage and the pad voltage to thereby accordingly result in the array reference voltage or the pad voltage tracking the constant reference voltage; and
- a driving and data outputting part for driving a data output terminal of the off-chip driver according to the impedance match and reset operations and setting a desired output impedance value at the data output terminal as a result thereof.

23. A programmable impedance control output circuit of a semiconductor device, comprising:
- an impedance detector having a transistor array responsive to a first control code data and an offset transistor array responsive to a second control code data for respectively outputting a first reference voltage from a first common node in the transistor and offset transistor arrays and a pad voltage from a second common node;
- a comparison part having:
  - a first comparator for outputting a first up/down control signal by comparing the first reference voltage and the pad voltage; and
  - a second comparator for outputting a second up/down control signal by comparing the first reference voltage and a second reference voltage, the second reference voltage being output by a resistant voltage divider;
- a counting part having:
  - a first counter that performs an up/down counting in response to the first up/down control signal to thereby generate a first code data for operating transistors of the transistor array; and
  - a second counter that performs an up/down counting in response to the second up/down control signal to thereby generate a second control code data for operating transistors of the offset transistor array;
- a higher code selector having:
  - a first higher code selector to select a first control code data having a higher code value by latching the first control code data and comparing it with a first control code data applied from a following latch cycle; and
  - a second higher code selector to select a second control code data having a higher code value by latching the second control code data and comparing it with a second control code data applied from a following latch cycle;
- an impedance driving part having:
  - a first impedance driver to generate buffer driving codes in response to the first control code data selected by the higher code selector; and
  - a second impedance driver to generate offset buffer driving codes in response to the second control code data selected by the higher code selector;
- a data output buffer having a plurality of unit output buffers to be selectively enabled in response to respective bit states of the buffer driving codes and offset buffer driving codes for enabling only unit output buffers to receive, buffering pairs of memory cell data and outputting them as pull-up and pull-down output data and offset pull-up and pull-down output data accordingly;
- an off-chip driver having transistor array and offset transistor array arranged in symmetry with a plurality of transistors for generating output data to an array common node by turning on transistors of an array respectively responding to a state of each type of output data and providing impedance-matched output data through an output pad connected with the array common node; and
- a constant code detecting part having first and second constant code detectors to detect constant codes in response to the first and second control code data selected by the higher code selector for generating mode control signals to alternately perform a first mode by which the first reference voltage and pad voltage are compared each other and a second mode by which the second reference voltage and the first reference voltage are compared each other.

24. The circuit, as defined in claim 23, wherein the transistor array includes a plurality of NMOS transistors with drain and source terminals being commonly connected to a supply voltage and the second common node, the NMOS transistors having different driving capacities to set a level of the pad voltage at the second common node by being turned on/off in response to the first control code data respectively applied to gate terminals, and pairs of NMOS transistors arranged in symmetry from the first common node commonly connecting drain and source terminals to a supply voltage and a ground voltage, the NMOS transistors having different driving capacities to set a level of the first reference voltage at the first common node by being turned on/off in response to the first control code data respectively applied to gate terminals; and
wherein the offset transistor array includes a plurality of offset NMOS transistors with drain and source terminals being commonly connected to supply voltage and the second common node, the offset NMOS transistors having different driving capacities to reset a level of the pad voltage at the second common node by being turned on/off in response to the second control code data respectively applied to gate terminals and pairs of offset NMOS transistors arranged in symmetry from the first common node commonly connecting drain and source terminals to a supply voltage and a ground voltage, the offset NMOS transistors having different driving capacities to reset a level of the first reference voltage at the first common node by being turned on/off in response to the second control code data respectively applied to gate terminals.

25. The circuit, as defined in claim 23, wherein the first comparator of the comparing part includes:
- a P-channel input-type cross coupled differential amplifier for amplifying a difference between levels of the first reference voltage and the pad voltage;
- an N-channel input-type cross coupled differential amplifier for receiving the output voltage to be respectively show in a pair of output lines of the P-channel input-type cross coupled differential amplifier and repetitively amplifying the difference between levels of the fit reference voltage and pad voltage;
- an output inverter for outputting a level of the output voltage to be set up by inverting an output voltage provided on one side of an output fine of the N-channel input-type cross coupled differential amplifier; and an inverter latch for outputting an inverted output of the output inverter as the first up/down control signal and continuously latching an inverted result until an output state of the output inverter is shifted.

26. The circuit, as defined in claim 23, wherein the first counter includes:

a logic combination part for generating an up/down counting signal by logically combining the first control code data and a first control code data generated in a previous cycle; and a plurality of T-type flip-flops connected in series for performing an up/down counting by receiving the up/down counting signal of a logic combination part with a trigger input terminal and thereafter outputting the first control code data to an output terminal.

27. The circuit as defined in claim 23, wherein the first higher code selector includes:

a selection signal generating part having a transmission gate comparing part for comparing the output data repetitively latched with tee first control code data and the currently applied first control code data according to a first and second logic; and a selection and output part for selecting and repetitively latching the first control code data having a higher code value, the output data being repetitively latched with the first control code data in response to the selection signal and the currently applied first control code data, and for outputting it as renewed first control code data.

28. The circuit, as defined in claim 23, wherein the first impedance driver includes:

transmission parts for respectively transmitting the first control code data output from the first higher code selector; and a driver control clock according to an output enable bar signal; and latch and output parts for generating the buffer driving codes by latching and outputting the output of the transmission parts.

29. The circuit, as defined in claim 23, wherein the data output buffer includes:

pull-up unit output buffer members for generating a NAND response by receiving a corresponding bit of the buffer driving codes, a corresponding bit of the offset buffer driving codes and one of the pairs of memory cell data;

pull-up inverter members respectively connected with the output terminals of the pull-up unit output buffer members for performing an inversion;

pull-down unit output buffer members for respectively generating a NAND response by receiving a corresponding bit of the normal buffer driving codes, a corresponding bit of the offset buffer driving codes and another of the pairs of memory cell data; and pull-down inverter members respectively connected with output terminals of the pull-down unit output buffer members for performing an inversion.

30. The claim, as defined in clam 23, wherein the transistor array of the off-chip driver includes:

pairs of NMOS transistors arranged in symmetry from an output common node commonly connecting source and drain terminals which are respectively connected to a supply voltage and a ground voltage, the NMOS transistors having different driving capacities to set a level of output data at the output common node by being turned on/off in response to the pull-up and pull-down output data respectively applied to gate terminals; and wherein the offset transistor array of the offset driver includes:

pairs of offset NMOS transistors arranged in symmetry from an output common node commonly connecting source and drain terminals which are respectively connected to a supply voltage and a ground voltage, the offset NMOS transistors having different driving capacities to set a level of output data at the output common node by being turned on/off in response to the offset pull-up and offset pull-down output data respectively applied to gate terminals.

31. The circuit, as defined in claim 23, wherein the first constant code detector includes:

a latch, logic comparison and detection part for repetitively latching the first control code data selected by the higher code selector, comparing it with a currently applied first control code data and detecting a constant code; and a flip-flop part for being reset in response to the first state of the second mode control signal, receiving and repetitively latching an output of the logic comparison detecting part and generating a first mode control signal; and wherein the second constant code detector of the constant code detecting part includes:

a latch, logic comparison and detection part for repetitively latching the second control code data selected by the higher code selector, comparing it with a currently applied second control code data and detecting a constant code and a flip-flop part for being reset in response to the first state of the second mode control signal, receiving and repetitively latching the output of the logic comparison detecting part and generating a second mode control signal.

32. A programmable impedance control output circuit of a semiconductor device comprising:

a clock generating unit for generating a clock control signal relating to impedance matching and shifting it to a internal circuit part;

an impedance detector having a transistor array responsive to a first control code data and an offset transistor array responsive to a second control code data for respectively outputting first reference voltage from the first common node of the arrays and pad voltage from the second common node;

a comparison part having a first comparator for outputting a first up/down control signal by comparison a first reference voltage and a pad voltage and a second comparator for outputting a second up/down control signal by comparing the first reference voltage and a second reference voltage, the second reference voltage being output by a resistant voltage divider;

a counting part having a first counter that performs an up/down counting in response to the first up/down control signal to thereby generate a first control code data for operating transistors of the transistor array and a second counter that performs an up/down counting in response to the second up/down control signal to thereby generate a second control code data for operating transistors of the offset transistor array;

a higher code selector having a first higher code selector to select a first control code data having a higher code value by latching the first control code data and comparing it with a first control code data applied from a following latch cycle, in order to set a higher control code data as a final value when a level of the pad voltage crosses that of the fast reference voltage in a first operation mode, and a second higher code selector to select a second control code data having a higher code value by latching the second control code data and comparing it with a second control code data applied from a following latch cycle, in order to set a higher control code data as a final value when a level of either the first reference voltage or the pad voltage crosses that of the second reference voltage in the first operation mode;

an impedance driving part having a first impedance driver to generate buffer driving codes in response to the first control code data selected by the higher code selector and a second impedance driver to generate offset buffer driving codes in response to the second control code data selected by the higher code selector;

a data output buffer having a plurality of unit output buffers to be selectively enabled in response to respective bit states of tee buffer driving codes and offset buffer driving codes for allowing only unit output buffers to be enabled to receive and buffer pairs of memory cell data and outputting them as pull-up and pull-down output data and offset pull-up and pull-down output data;

an off-chip driver having transistor array and offset transistor array arranged in symmetry with a plurality of transistors for generating impedance-matched output data to an array common node by turning on the transistors of a corresponding array respectively responding to a state of each type of output data and providing impedance-matched output data through an output pad connected with the array common node; and a constant code detecting part having first and second constant code detectors that operate to be alternately enabled in response to the first and second control code data selected by the higher code selector for generating mode control signals to perform a first operation mode by which the first reference voltage and the pad voltage are compared each other and a reset operation mode by which the first reference voltage and the pad voltage are selectively compared with a second reference voltage.

33. A method for controlling an output impedance of a semiconductor device comprising the steps of:

performing a first code operation in which an array reference voltage is compared with a pad voltage of a pad connected to an external resistor having a predetermined resistance value to result in the pad voltage tracking the array reference voltage, thereafter driving an impedance of a data output terminal so that a desired output impedance value is set at a data output terminal; and performing an offset code operation to reset a level of the pad voltage or the array reference voltage in which the reference voltage predetermined by a resistant voltage divider is selectively compared with either the array reference voltage or the pad voltage to result in the selectively compared voltage racking a constant reference voltage, thereafter driving the impedance to a desired output impedance value at a data output terminal.

34. The method, as defined in claim 33, wherein a resistance value of the external resistor is five times as great as hat of a line to be interfaced.

35. The method, as defined in claim 33, wherein a level of the constant reference voltage is set at half of a supply voltage.

36. The method, as defined in claim 33, wherein the first and offset code operations are alternately performed.

37. The method, as defined in claim 33, wherein the pad voltage and the array reference voltage array applied by an impedance detector having a transistor array and an offset transistor array consisting of MOS transistors.

38. The method, as defined in claim 37, wherein an impedance driving process of the data output terminal is performed by selectively controlling the transistor array and the offset transistor array constructed in an off-chip driver.

39. The method, as defined in claim 38, wherein the array of the off-chip driver is constructed in the same internal structure as that of the impedance detector.

40. The method, as defined in claim 37, wherein the MOS transistors are all NMOS field effect transistors.

41. The method, as defined in claim 37, wherein the transistor array and the offset transistor array provide the pad voltage are respectively controlled by 5 bits and 3 bits.

42. The method, as defined in claim 37, wherein the transistor array and the offset transistor array to provide array reference voltage consist of transistors arranged in symmetry, and the transistors respectively controlled by 5 bits and 3 bits.

43. A method for matching an output impedance of a semiconductor memory device, comprising:

matching the output impedance by comparing a pad voltage of a pad connected to an external resistor having a preset resistance value to an array reference voltage to result in the pad voltage tracking the array reference voltage and accordingly performing an impedance driving process of a data output terminal (step 1);

matching the output impedance to a reset a level of the array reference voltage by comparing a constant reference voltage set by a resistant voltage divider with the array reference voltage to result in the array reference voltage tracking the constant reference voltage and accordingly performing an impedance driving process of the data output terminal (step 2);

matching the output impedance to a reset a level of the pad voltage by comparing the constant reference voltage wit the pad voltage to result in the pad voltage tracking the constant reference voltage and accordingly performing an impedance driving process of the data output terminal (step 3); and sequentially and repeatedly performing the first, second and third steps described above.

* * * * *

UNITED STATES PATENT AND TRADEMARK OFFICE
CERTIFICATE OF CORRECTION

PATENT NO. : 6,307,424 B1
DATED : October 23, 2001
INVENTOR(S) : Lee

It is certified that error appears in the above-identified patent and that said Letters Patent is hereby corrected as shown below:

Column 1,
Line 11, "data," should read -- data. --.
Line 45, "min detection" should read -- miss detection --.

Column 2,
Line 35, "few and second" should read -- first and second --.
Line 37, "bufer" should read -- buffer --.
Line 58, "110 an" should read -- 110, an --.

Column 3,
Line 40, "CZQx" should read -- CZQX --.
Line 54, "Signal" should read -- signal --.
Line 58, "tee time" should read -- the time --.
Line 61, "matching Thus" should read -- matching. Thus --

Column 4,
Line 8, "devices and" should read -- device, and --.
Line 18, "'off-chip drivers'" should read -- 'off-chip driver' --.
Line 19, "Galbi ct al." should read -- Galbi et al. --.
Line 19, "'off-chip drive'" should read -- 'off-chip driver' --.
Line 20, "in her detail" should read -- in further detail --.
Line 59, "130" should read -- I30 --.

Column 5,
Line 17, "i42" should read -- I42 --.
Line 33, "120" should read -- I20 --.

Column 7,
Lin 22, "2101" should read -- 210-1 --.
Line 45, "CTQNOQ" should read -- CTQNO1 --.

Column 8,
Line 6, "11" should read -- I1 --.
Line 44, "i6" should read -- I6 --.

Column 9,
Line 13, "CTQD~" should read -- CTQD1~ --.

UNITED STATES PATENT AND TRADEMARK OFFICE
CERTIFICATE OF CORRECTION

PATENT NO. : 6,307,424 B1
DATED : October 23, 2001
INVENTOR(S) : Lee

It is certified that error appears in the above-identified patent and that said Letters Patent is hereby corrected as shown below:

Column 12,
Line 4, "VDDQ12" should read -- VDDQ/2 --.
Line 8, "VDDQ/2." should read -- VDDQ/2, --.
Line 14, "650 The" should read -- 650. The --.
Line 21, "IN1~IN5" should read -- 1N1~1N5 --.
Line 22, "tee array" should read -- the array --.
Line 44, "VZQ Then. out" should read -- VZQ. Then, out --.
Line 46, "arm" should read -- are --.
Line 57, "REP" should read -- REF --.

Column 13,
Line 7, "R1 and R" should read -- R1 and R2 --.

Column 15,
Line 12, "way adapted" should read -- array adapted --.

Column 17,
Line 13, "fit up" should read -- first up --.
Line 22, "respectively" should read -- repetitively --.
Line 54, "performing inversion" should read -- performing an inversion --.

Column 18,
Line 3, "detection" should read -- detecting --.
Lines 10-11, "respectively" should read -- repetitively --.
Line 23, "computing it" should read -- comparing it --.
Line 60, "teal" should read -- terminal --.
Line 65, "arm" should read -- are --.
Line 66, "sane" should read -- same --.

Column 19,
Line 42, "first code" should read -- first control code --.

Column 21,
Line 23, "tee" should read -- the --.
Line 61, "clam" should read -- claim --.

Column 22,
Line 51, "comparison" should read -- comparing --.

UNITED STATES PATENT AND TRADEMARK OFFICE
CERTIFICATE OF CORRECTION

PATENT NO.    : 6,307,424 B1
DATED         : October 23, 2001
INVENTOR(S)   : Lee It is certified that error appears in the above-identified patent and that said Letters Patent is hereby corrected as shown below:

<u>Column 23,</u>
Line 4, "fast" should read -- first --.
Line 22, "tee" should read -- the --.

<u>Column 24,</u>
Line 1, "racking" should read -- tracking --.
Line 7, "hat" should read -- that --.
Line 15, "voltage array" should read -- voltage are --.
Line 33, "transistors respectively" should read -- transistors are respectively --.
Line 53, "wit" should read -- with --.

Signed and Sealed this

Tenth Day of September, 2002

*Attest:*

*Attesting Officer*

JAMES E. ROGAN
*Director of the United States Patent and Trademark Office*